(12) United States Patent
Tezuka

(10) Patent No.: US 7,675,115 B2
(45) Date of Patent: Mar. 9, 2010

(54) SEMICONDUCTOR DEVICE AND METHOD FOR MANUFACTURING THE SAME

(75) Inventor: Tsutomu Tezuka, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 170 days.

(21) Appl. No.: 11/146,071

(22) Filed: Jun. 7, 2005

(65) Prior Publication Data
US 2005/0269595 A1 Dec. 8, 2005

(30) Foreign Application Priority Data
Jun. 8, 2004 (JP) .............................. 2004-170403

(51) Int. Cl.
*H01L 29/772* (2006.01)
(52) U.S. Cl. .............................. 257/351; 257/E29.295
(58) Field of Classification Search ................ 257/392, 257/347–351, 353, E29.295
See application file for complete search history.

(56) References Cited

U.S. PATENT DOCUMENTS

| | | | | |
|---|---|---|---|---|
| 5,847,419 | A * | 12/1998 | Imai et al. .................... | 257/192 |
| 2003/0227036 | A1 * | 12/2003 | Sugiyama et al. ............ | 257/288 |
| 2004/0155256 | A1 | 8/2004 | Tezuka et al. | |
| 2005/0098234 | A1 | 5/2005 | Nakaharai et al. | |
| 2006/0125008 | A1 * | 6/2006 | Chidambarrao et al. ..... | 257/347 |

FOREIGN PATENT DOCUMENTS

| JP | 7-106434 | 4/1995 |
|---|---|---|
| JP | 9-219524 | 8/1997 |
| JP | 11-238860 | 8/1999 |
| JP | 2001-160594 | 6/2001 |
| JP | 2003-197702 | 7/2003 |
| JP | 2003-229580 | 8/2003 |
| JP | 2003-243528 | 8/2003 |
| JP | 2003-258212 | 9/2003 |
| JP | 2004-39762 | 2/2004 |

OTHER PUBLICATIONS

Rim, et al., "Fabrication and Mobility Characteristics of Ultra-thin Strained Si Directly on Insulator (SSDOI) MOSFETs", IEDM Tech. Dig., pp. 49-52, (Dec. 8, 2003).

Tezuka, et al., "Novel fully-depleted SiGe-on-insulator pMOSFETs with high-mobility SiGe surface channels", IEDM Tech. Dig., pp. 946-948, (2001).

Notification of Reasons for Rejection mailed Oct. 30, 2007, issued by the Japanese Patent Office in counterpart Japanese Application No. 2004-170403, and English translation thereof.

(Continued)

*Primary Examiner*—Allan R. Wilson
(74) *Attorney, Agent, or Firm*—Finnegan, Henderson, Farabow, Garrett & Dunner, L.L.P.

(57) ABSTRACT

A semiconductor device includes a Si substrate, an insulating film formed on onepart of the Si substrate, a bulk Si region grown on other part of the Si substrate other than the insulating film, Si1-xGex (0<x≦1) thin film formed on the insulating film in direct contact with the insulating film, and substantially flush with top of the bulk Si region, a first field effect transistor fabricated in the bulk Si region, and a second field effect transistor fabricated in the Si1-xGex thin film.

15 Claims, 30 Drawing Sheets

OTHER PUBLICATIONS

Langdo, T.A., Preparation of Novel SiGe-Free Strained Si on Insulator Substrates,: *2002 IEEE International SOI Conference* (Oct. 2002).

Notification of Reasons for Rejection mailed May 23, 2006, issued by the Japanese Patent Office in counterpart Japanese Application No. 2004-170403, and English translation thereof.

* cited by examiner

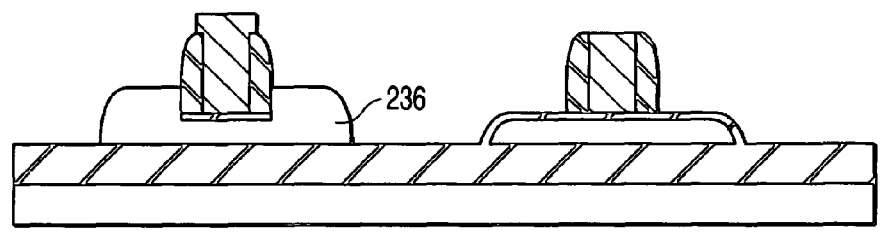
F I G. 1 0 A
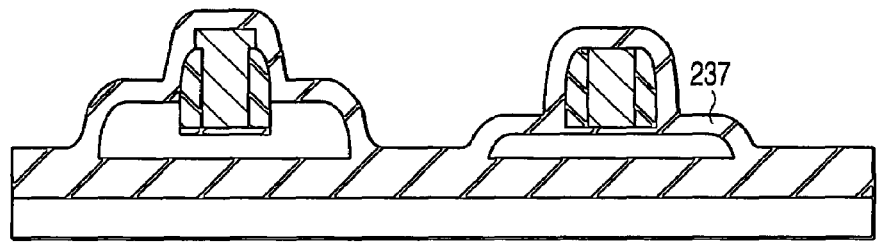
F I G. 1 0 B
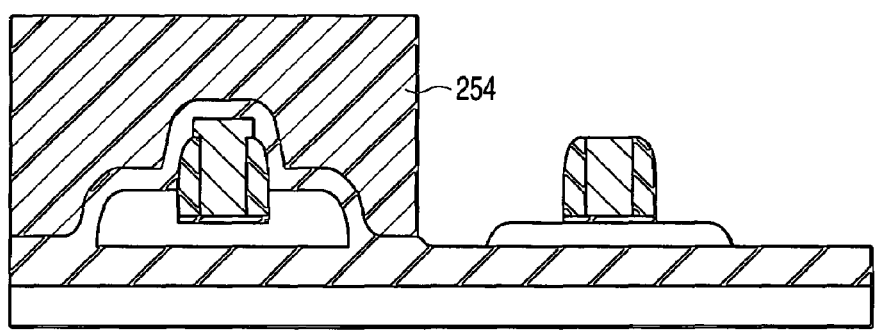
F I G. 1 0 C
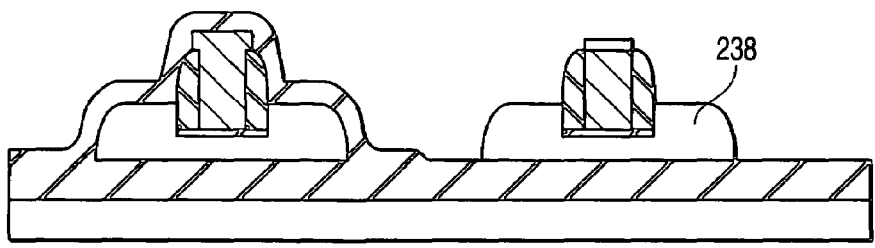
F I G. 1 0 D

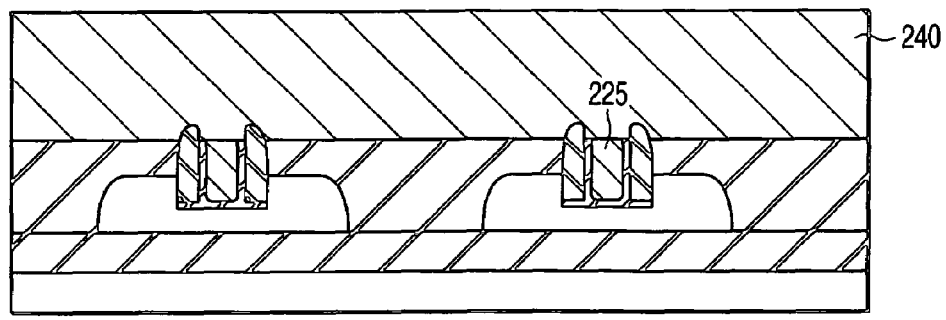
F I G. 1 2 A
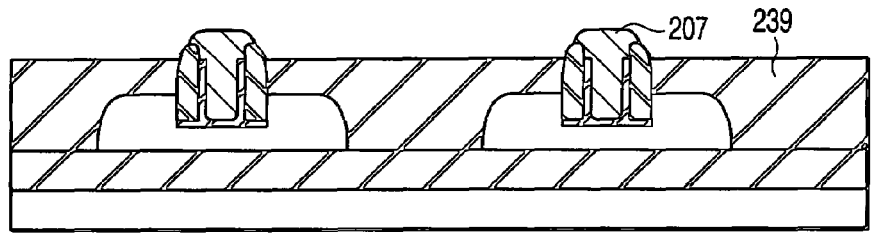
F I G. 1 2 B
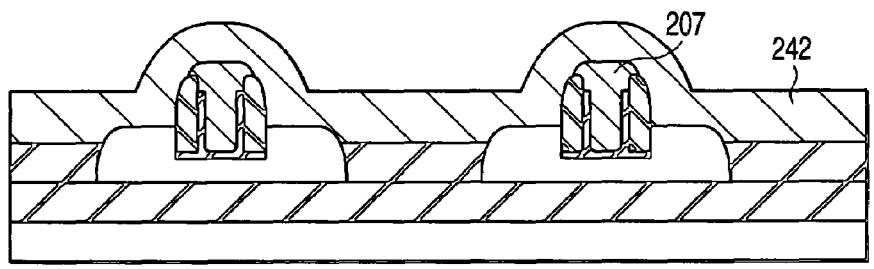
F I G. 1 2 C
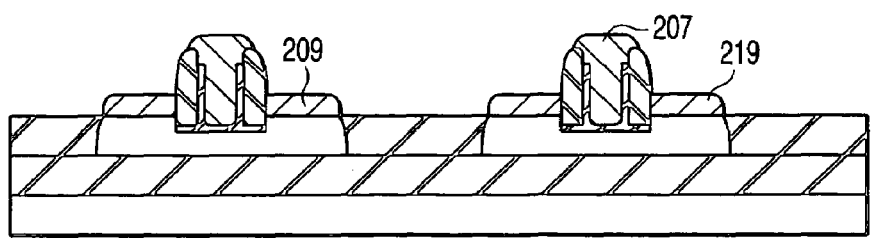
F I G. 1 2 D

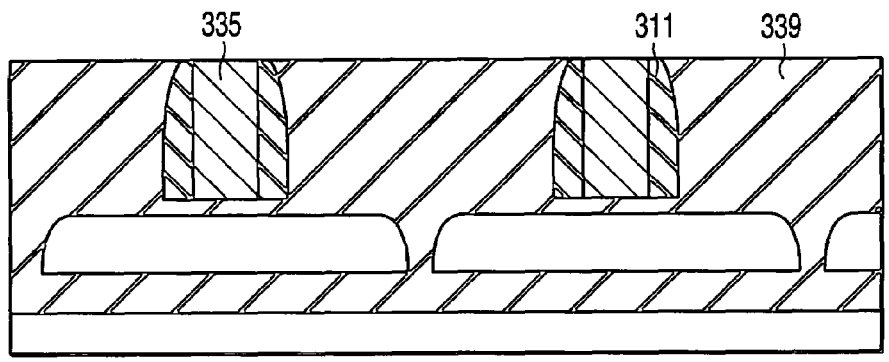
F I G. 1 6 A
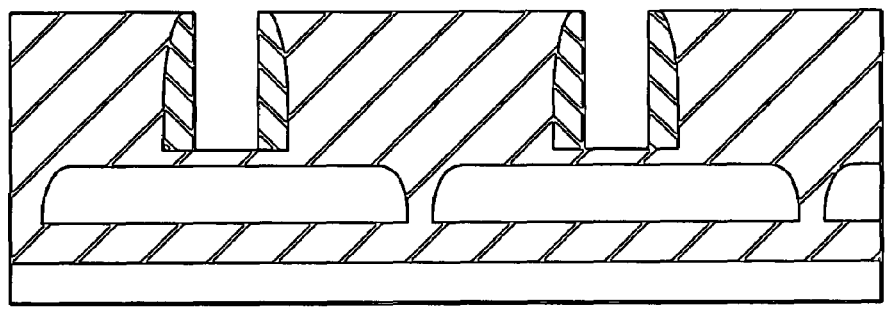
F I G. 1 6 B
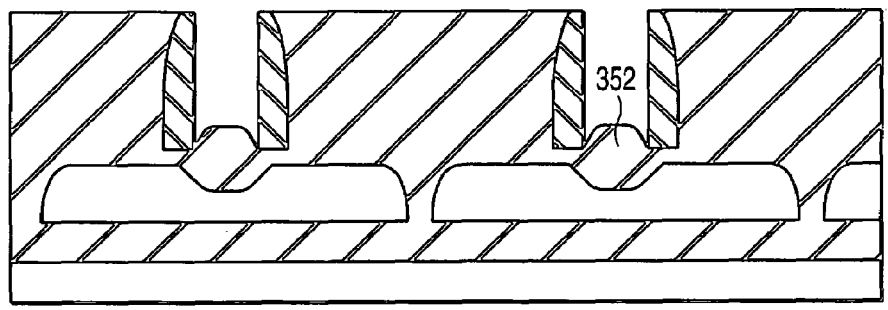
F I G. 1 6 C
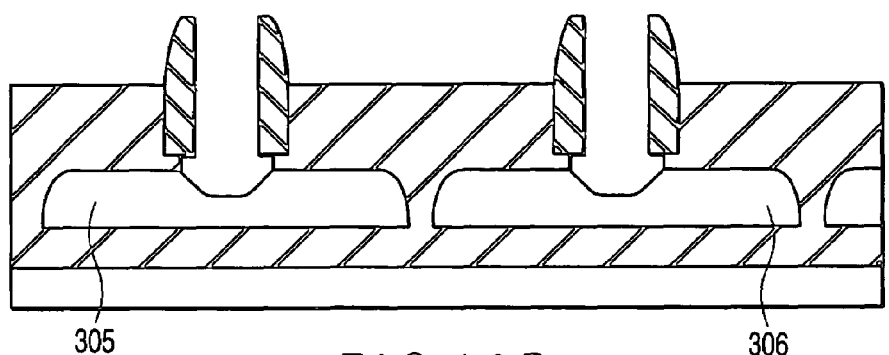
F I G. 1 6 D

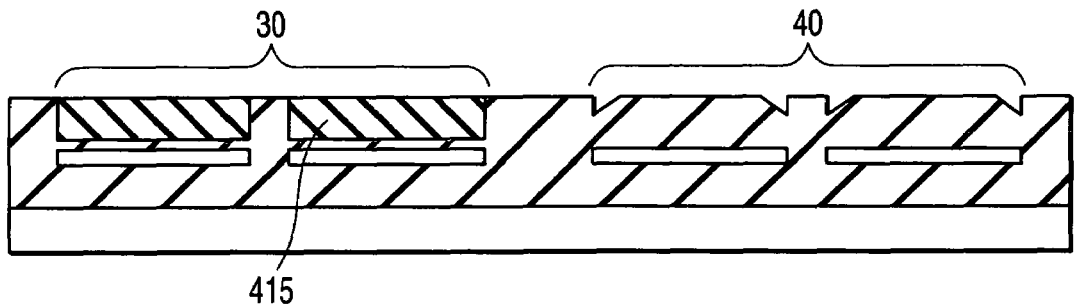
F I G. 2 3 A
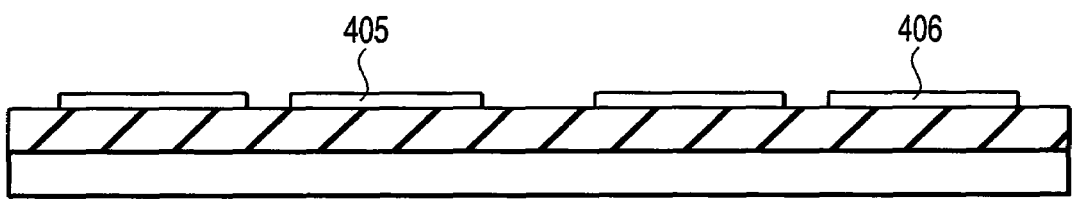
F I G. 2 3 B
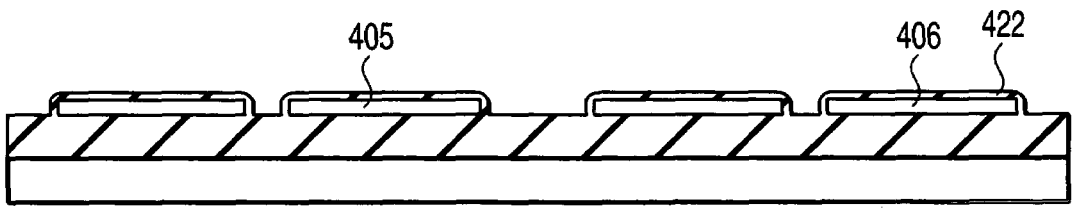
F I G. 2 3 C

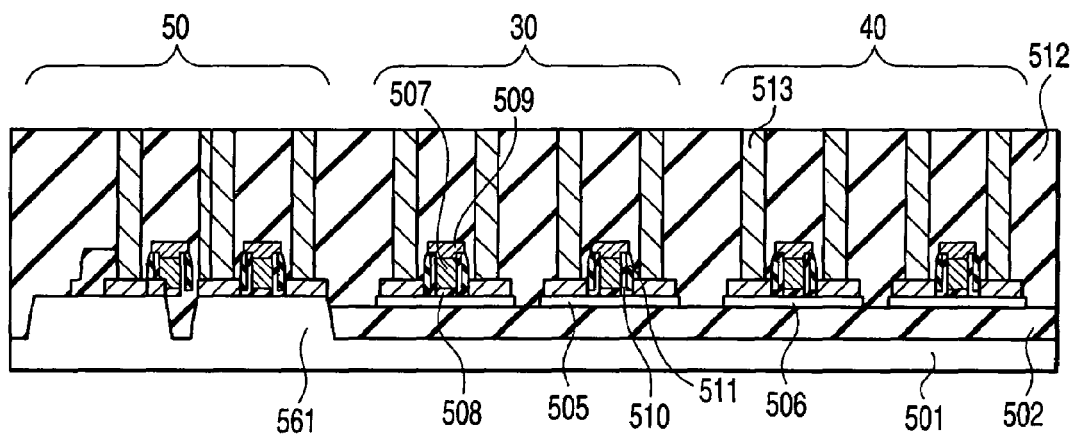
F I G. 2 4
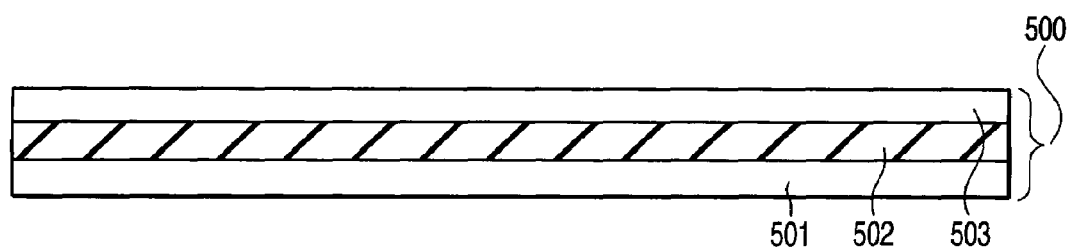
F I G. 2 5 A
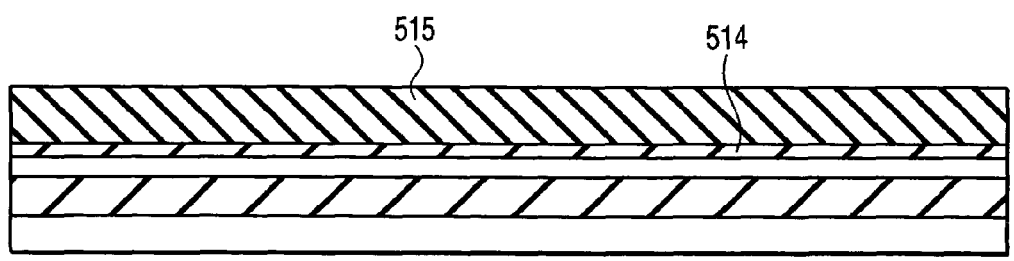
F I G. 2 5 B

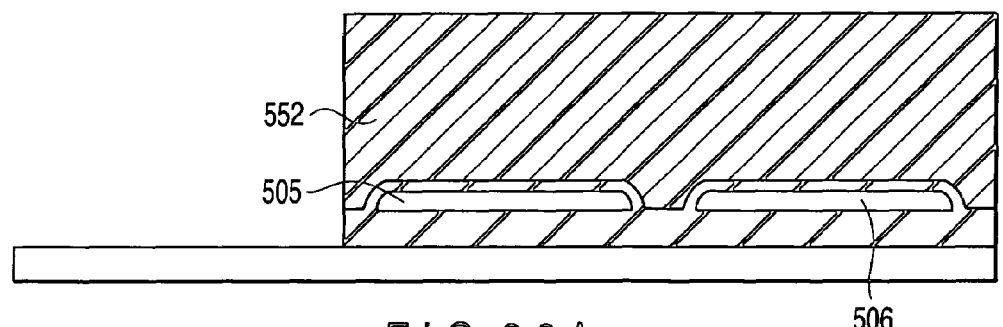
F I G. 26 A
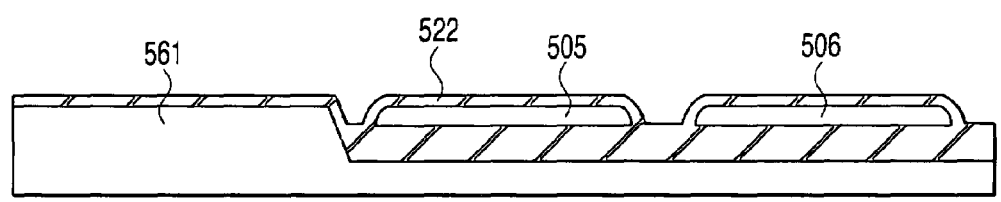
F I G. 26 B
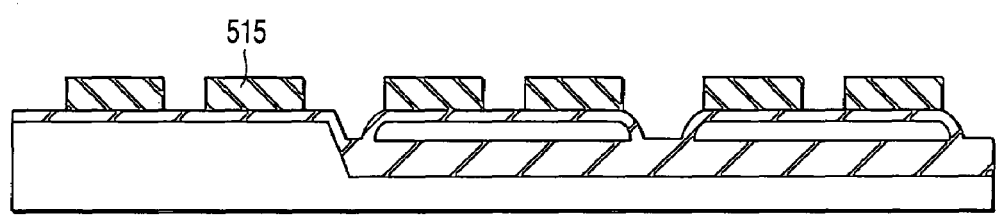
F I G. 26 C
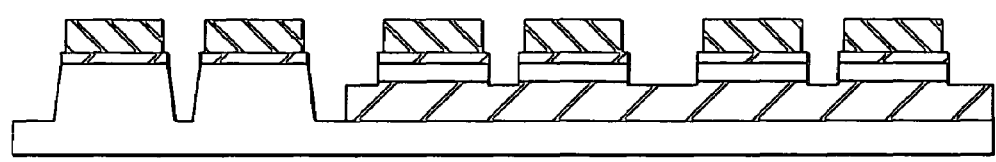
F I G. 26 D
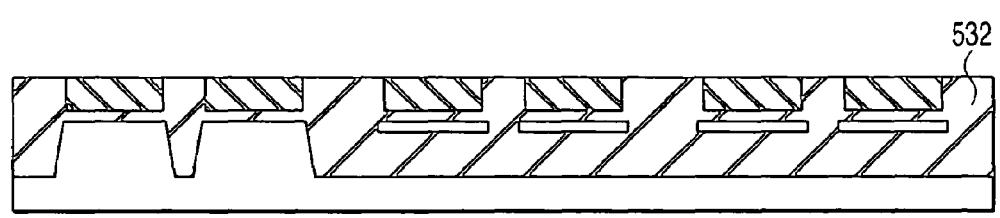
F I G. 26 E

SEMICONDUCTOR DEVICE AND METHOD FOR MANUFACTURING THE SAME

CROSS-REFERENCE TO RELATED APPLICATIONS

This application is based upon and claims the benefit of priority from prior Japanese Patent Application No. 2004-170403, filed Jun. 8, 2004, the entire contents of which are incorporated herein by reference.

BACKGROUND OF THE INVENTION

1. Field of the Invention

The invention relates to a semiconductor device and a method for manufacturing the same, particularly to a semiconductor device having a metal insulator semiconductor field effect transistor (MIS FET) characterized by high current drive power and having a channel formed of strained Si, strained SiGe or Ge.

2. Description of the Related Art

In recent years, it is considered for the purpose of realizing high-performance and high-function of a CMOS circuit device to use channel materials of high mobility such as strained Si or strained SiGe (including Ge).

The strained Si has an tensile strain in in-plain direction of the substrate. The band structure of the strained Si varies due to this tensile strain, so that both electron and hole mobilities increase in comparison with an unstrained Si. Usually, the strained Si is formed on a lattice relaxed SiGe of a greater lattice constant by epitaxial growth. The strain in the strained Si layer increases as the Ge composition of a SiGe template increases, resulting in increasing the mobility. If CMOS is fabricated by MOSFET having the strained Si channel, it is expected to operate at a higher speed than Si-CMOS of the same size.

On the other hand, the strained SiGe has a compressive strain in in-plain direction of the substrate and varies in its band structure due to this compressive strain, resulting in that the hole mobility increases in comparison with an unstrained Si. However, increase of the electron mobility is smaller in comparison with the hole mobility when the Ge fraction is not sufficiently high. When the SiGe channels have compressive strain of around 1% and Ge composition larger than around 80%, both electron mobility and hole mobility increase more than 2 times in comparison with the unstrained Si. As a result, the maximum enhancement of the mobility is provided in a pure Ge channel. If CMOS is fabricated by MOSFET having a strained SiGe of high Ge composition, it is expected to operate at higher speed than the strained Si-CMOS as well as Si-CMOS of the same size.

Further, the strained SGOI (SiGe-on-Insulator)-MOSFET (for example, MOSFET described in a non-patent literature (T. Tezuka et al., IEDM Technical Digests, p. 946 (2001)) fabricated by combination of the strained SiGe-MOSFET with a SOI (Si-on-Insulator) structure has merits obtained by the SOI structure such as decrease of junction capacitance, decrease of device size with the impurity density being lowered, as well as merit obtained by the high carrier mobility of the strained SiGe channel. Accordingly, if a CMOS logic circuit is fabricated by a MOSFET of a strained SGOI channel, an operation of higher-speed and lower power is expected.

However, since the SiGe has a band gap smaller than a conventional Si, a junction leakage current increases inevitably, resulting in lowering a breakdown voltage. Accordingly, for the SOC (System-on-Chip) application that integrates in a single LSI chip a plurality of kinds of MOSFETs such as LOP (Low Operation Power)-MOSFET for a low power operation and low standby power operation, LSP (Low Stand-by Power)-MOSFET and high breakdown voltage MOSFET as well as HP (High performance)-MOSFET for high speed operation, it is preferable that a SGOI channel is used for the HP-MOSFET and a bulk Si or SOI or a strained SOI is used for the LOP- and LSP-MOSFET.

An example which integrates strained SOI-MOSFETs and SGOI-MOSFETs is provided by, for example, a patent literature 1 (Japanese Patent Laid-Open No. 2001-160594). In this literature, the n channel has a bi-layer structure of a lattice-relaxed SiGe and a strained Si. Accordingly, SiGe layers are used in both p, n channels. However, because SiGe has a band gap smaller than a conventional Si regardless of strain or non-strain, a junction leakage current increases necessarily, resulting in lowering a withstand voltage. Accordingly, for SOC (System-on-Chip) application, it is difficult due to SiGe layer to satisfy specifications of leakage and breakdown voltage in devices other than HP-MOSFET.

In this way the conventional art provides a configuration that integrates a SOI-MOSFET and a SGOI-MOSFET for the purposed of realizing high-performance and high-function of CMOS circuit device. However, since this configuration uses a SiGe layer for both p, n channels, it is difficult due to the SiGe layer to satisfy specifications of leakage and breakdown voltage in devices other than HP-MOSFET. In other words, it is difficult to realize both high-speed operation and low-power operation.

Further, in reducing the size of a MOSFET of SOI structure, it is necessary to decrease a thickness of a channel layer on a buried oxide film. In particular, it is necessary for realizing an operation of a fully depleted device to decrease a film thickness to about ¼ of a gate length. This request means that it is necessary for making a gate length, for example, 20 nm to make a channel film thickness (additional value of film thickness of a strained Si and that of a lattice-relaxed SiGe in nMOSFET of the patent literature 1) nm. It is very difficult to realize such decreasing of film thickness in a multi-layer structure while maintaining productivity.

The present invention is to provide a semiconductor device capable of realizing an integrated circuit device having both high-speed operation and low-power operation by combining bulk Si, a SOI thin film, a SGOI thin film, etc. and a method of manufacturing the same.

BRIEF SUMMARY OF THE INVENTION

An aspect of the present invention provides a semiconductor device comprising: a Si substrate; insulating films formed on one part of the Si substrate; a bulk Si region grown on other part of the Si substrate other than the insulating film; a Si1-xGex ($0<x\leq1$) thin film formed on the insulating film in direct contact with the insulating film, and substantially flush with top of the bulk Si region; a first field effect transistor fabricated in the bulk Si region; and a second field effect transistor fabricated in the Si1-xGex thin film.

Another aspect of the present invention provides a method of manufacturing a semiconductor device comprising: preparing a Si thin film on an insulating film to produce a first semiconductor structure; forming a Si1-yGey ($0<y\leq1$) thin film on one part of the Si thin film to produce a second semiconductor structure; annealing the second semiconductor structure in ambient atmosphere including oxygen to oxidize the Si1-yGey thin film on the Si thin film for forming a Si oxide film on top thereof and a Si1-xGex ($0<x\leq1$, $x>y$) thin film coming in direct contact with the insulating film; removing the Si oxide film or film; fabricating a first field effect transistor in the Si thin film or isolated Si film from the Si thin film; and fabricating a second field effect transistor in the Si1-xGex thin film.

BRIEF DESCRIPTION OF THE SEVERAL VIEWS OF THE DRAWING

FIGS. 10A to 10D are sectional views of semiconductor structures in following processing steps of a method of manufacturing the semiconductor device of the fourth embodiment.

FIGS. 12A to 12D are sectional views of semiconductor structures in following processing steps of a method of manufacturing the semiconductor device of the fourth embodiment.

FIGS. 16A to 16D are sectional views of semiconductor structures in following processing steps of a method of manufacturing the semiconductor device of the fifth embodiment.

FIGS. 23A to 23C are sectional views of semiconductor structures in following processing steps of a method of manufacturing the semiconductor device of the seventh embodiment.

FIG. 24 is a schematic sectional view of a semiconductor device concerning an eighth embodiment of the present invention.

FIGS. 25A to 25E are sectional views of semiconductor structures in processing steps of a method of manufacturing the semiconductor device of the eighth embodiment.

FIGS. 26A to 26E are sectional views of semiconductor structures in following processing steps of a method of manufacturing the semiconductor device of the seventh embodiment.

DETAILED DESCRIPTION OF THE INVENTION

There will be described in detail embodiments of the present invention referring to figures.

First Embodiment

Figure 1:
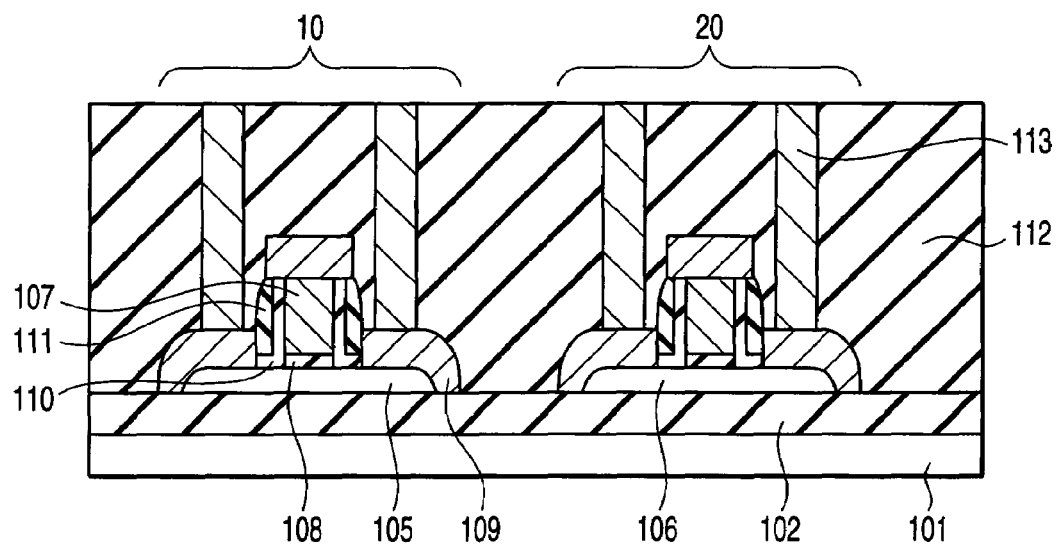
FIG. 1 is a schematic sectional view of a semiconductor device concerning a first embodiment of the present invention.

FIG. 1 is a schematic sectional view of a semiconductor device concerning a first embodiment of the present invention.

As shown in FIG. 1, a silicon oxide film (insulating film) 102 of 50 nm in thickness is formed on a substrate 101. A strained Si layer (SOI layer) 105 of 5 nm in thickness is formed as a first semiconductor layer on one part of the silicon oxide film 102, and a strained Ge layer (GOI layer) 106 of 5 nm in thickness is formed as a second semiconductor layer on the other part of the silicon oxide film 102. An n channel MISFET 10 is fabricated in the strained Si layer 105, and a p channel MIS FET 20 is fabricated in the strained Ge layer 106. In other words, FETs of a complementary type metal-insulator-semiconductor (MIS) structure are fabricated on the substrate 101.

Gate electrodes 107 are formed on the strained Si layer 105 and strained Ge layer 106, respectively, with gate insulating films 108 interposed between the gate electrodes 107 and the strained Si layer 105 and strained Ge layer 106. Side wall insulating films 110 and 111 are formed on the side wall of the gate electrode 107. Impurity is ion-implanted into the strained Si layer 105 on the both sides of the gate to form source and drain regions. The gate electrode (gate length=20 nm) 107 is formed of poly Si0.35Ge0.65 for each of nMISFET10 and pMISFET20. The gate insulating film 108 is formed of a HfSiON film of 3 nm in thickness. A nickel-germanium-silicide Ni(Si0.35Ge0.65) film 109 is formed on the gate electrode 107 and source and drain regions. An interlayer insulating film 112 is formed of a Si oxide film, and a wiring electrode 113 is formed of Al. The SOI layer 105 and GOI layer 106 each have (100)-surface.

The present embodiment provides an FET circuit device of a complementary type metal insulator semiconductor (CMIS) structure comprising an nMISFET 10 and a pMISFET 20 on the silicon oxide film 102 of 50 nm in thickness formed on the Si substrate 101. The nMISFET 10 has a channel of the strained SOI layer 105, and the pMISFET20 has a channel of the strained GOI layer 106. Both channels each are 5 nm in thickness.

A method of manufacturing a semiconductor device of the present embodiment will be described referring to FIGS. 2 to 5.

Figure 2A:
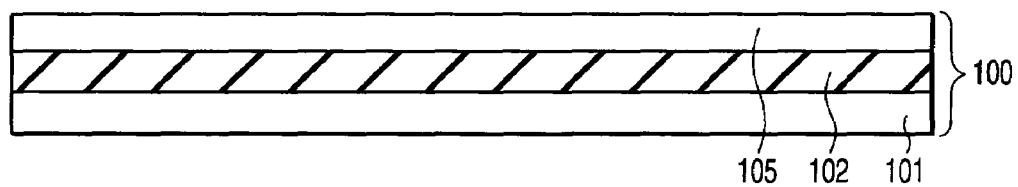
FIGS. 2A to 2E are sectional views of semiconductor structures in processing steps of a method of manufacturing the semiconductor device of the first embodiment.

As shown in FIG. 2A, a strained SOI substrate 100 is prepared. This strained SOI substrate 100 is formed of a Si substrate 101, a Si oxide film 102 on the Si substrate 101, and a strained Si layer (SOI layer) 105 on the Si oxide film 102. The strained SOI layer 105 is 7.5 nm thick and 1.24% in tensile strain. This strain is comparable with that in a strained Si layer epitaxially grown on a lattice-relaxed Si0.7Ge0.3 layer. The strain is represented by a factor named effective Ge composition xeff. In other words, the tensile strain equivalent to xeff=0.3 is equal to the strain of the Si layer formed on the lattice-relaxed Si0.7Ge0.3. In the present embodiment, the strain of the strained SOI layer 105 is xeff=0.3.

To give the SOI layer 105 the strain, the strained Si layer formed on, for example, the lattice-relaxed SiGe layer is bonded to a Si substrate with an insulating film interposed therebetween, and then the SiGe layer is removed (for example, T. A. Langdo et al., 2002 IEEE Int. SOI Conf., p 211.).

Figure 2B:
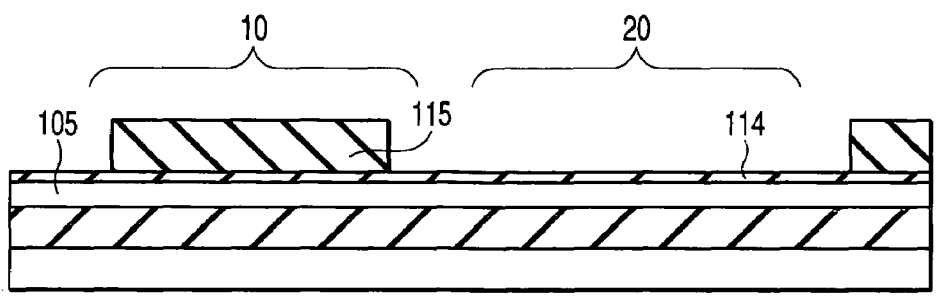

As shown in FIG. 2B, a Si oxide film 114 of 5 nm in thickness is formed on the strained Si layer 105 by thermal oxidation, and then a Si nitride 115 of 20 nm in thickness is deposited on the Si oxide film 114. The Si nitride 115 is selectively removed by photolithography to form a mask on a region for forming the nMISFET 10.

Figure 2C:
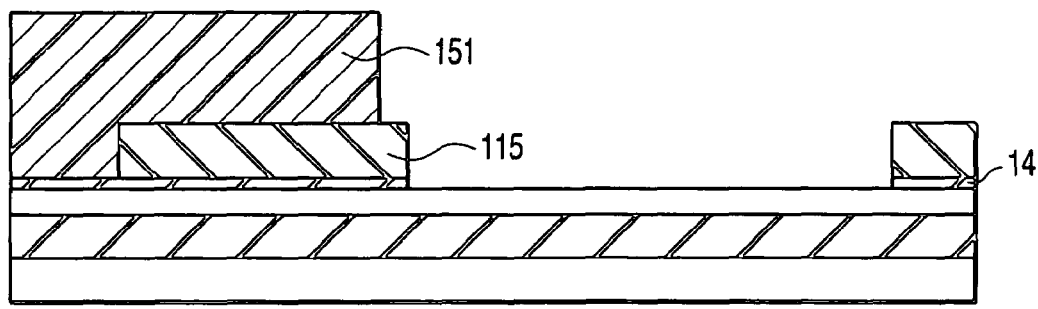

As shown in FIG. 2C, the region for forming the nMISFET 10 is protected by a photoresist 151, and then the Si oxide film 114 on the region for forming the pMISFET 20 is removed.

Figure 2D:
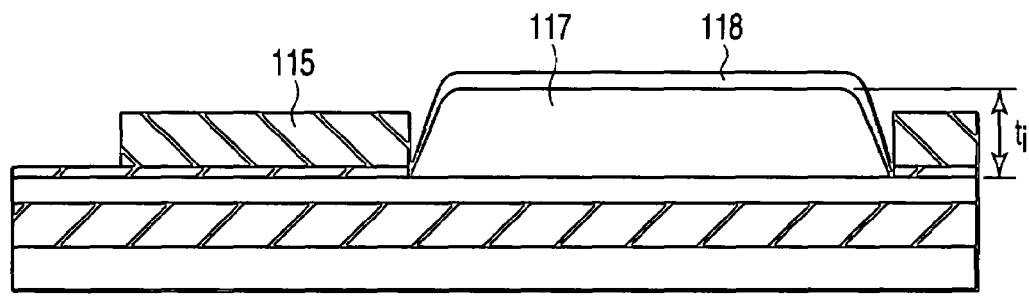

As shown in FIG. 2D, after having removed the photoresist 151, a Si0.8Ge0.2 layer 117 of 25 nm in thickness and a Si layer 118 of 5 nm in thickness are selectively grown on the exposed region of the strained SOI substrate sequentially by UHV-CVD method or LP-CVD method. Because the strained SOI layer 105 of the template has a tensile strain of xeff=0.3, the SiGe layer 117 has a tensile strain unlike a conventional Si.

Figure 2E:
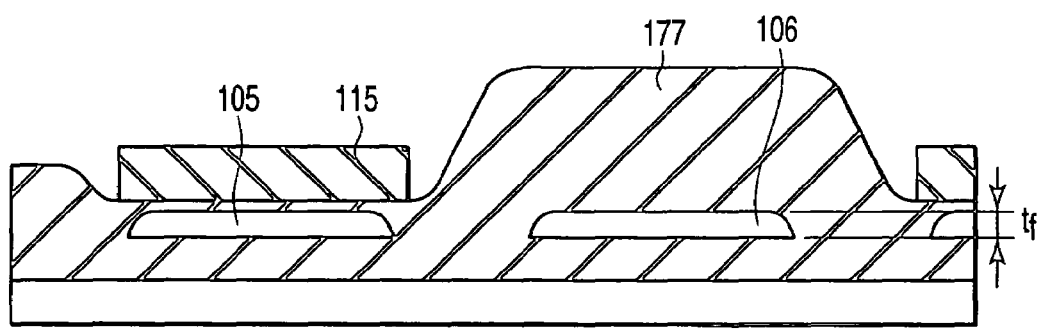

As shown in FIG. 2E, the wafer is subjected to thermal oxidation while decreasing the temperature to 1100° C., 1000° C., 900° C. step by step. The interface between the Si and SiGe layers is vanished as the oxidation proceeds, whereby a SGOI layer of almost uniform composition is formed. Ge is rejected from the oxide film during oxidation and accumulated in the SGOI layer. Ge composition increases in inverse proportion to the thickness of the SGOI layer (oxidation-induced condensation).

Accordingly, a SiGe film thickness tf and Ge composition xf after oxidation are optionally controllable, and can harmonize with the thickness of the Si layer of other region. In other words, the SiGe film thickness ti and Ge composition xi before oxidation have a relation of xf/xi=ti/xf. This condensation method is well known, but a new point of the present embodiment is to form selectively a SiGe layer only on a limited region of the SOI substrate, and to provide a substrate including a single Si layer and a single SiGe layer together by configuring a SGOI structure only on the limited region.

Almost all Si atoms are oxidized when the film thickness becomes 5 nm, resulting in a Si oxide film 177 and a Ge layer (GOI layer) 106. This GOI layer 106 has a compressive strain equivalent to xeff=0.7. This means that lattice constant parallel to the substrate surface plane does not vary in the condensation process.

As described above, the method of epitaxially growing a SiGe layer on one part of the SOI substrate selectively and subjecting the selective grown part to oxidation concentration increases Ge composition and thins the layer. As a result, a single layer region of Ge can be partially formed. Since this GOI region has high mobility of hole carriers, a high speed device can be realized by fabricating pMISFET on the GOI region. Further, when the GOI layer is formed by the oxidation concentration method, the gross weight of Ge is saved in an oxidation process. Therefore, the thickness of the GOI layer can be controlled in ease by setting the thickness of the SiGe layer and the Ge composition thereof beforehand.

Figure 3A:
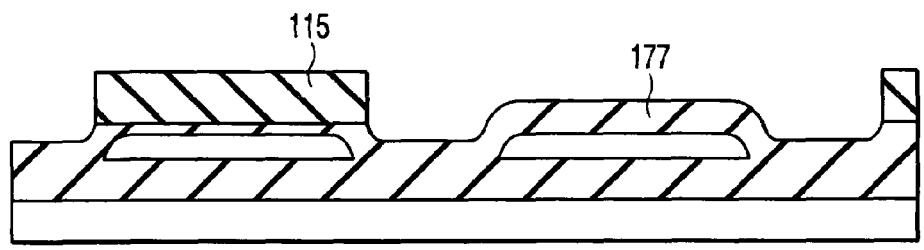
FIGS. 3A to 3D are sectional views of semiconductor structures in following processing steps of a method of manufacturing the semiconductor device of the first embodiment.
Figure 3B:
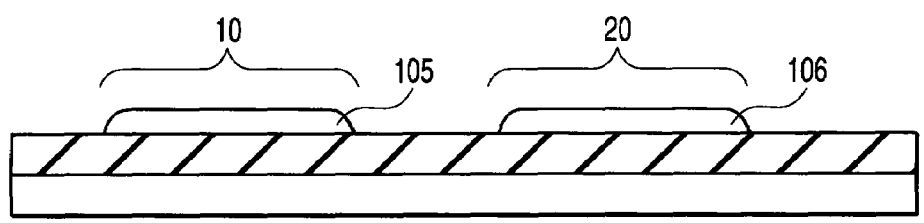
Figure 3C:
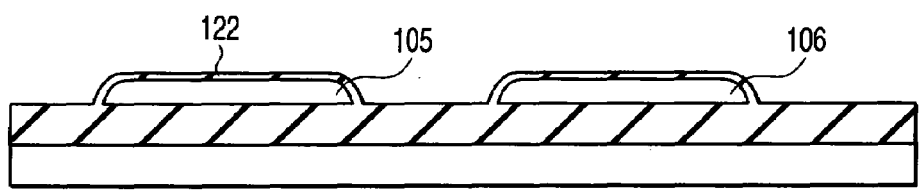
Figure 3D:
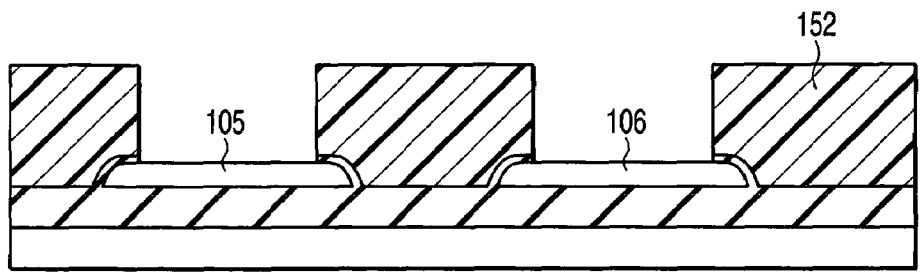

As shown in FIG. 3A, after the Si oxide film 177 is flattened by a CMP method, the Si oxide film 177 is more thinned by a RIE method. As shown in FIG. 3B, the SiN film 115 is removed by a CDE method, and the active region of the strained SOI layer 105 and the active region of the strained GOI layer 106 are exposed by diluted hydrofluoric acid. As shown in FIG. 3C, after a Si oxide film 122 of 2 nm in thickness is deposited on the strained SOI layers 105 and 106 by a CVD method, B and As ions are implanted into n and p channel regions, respectively. As shown in FIG. 3D, a photoresist 152 is formed on the Si oxide film 102. The photoresist 152 is bored only on the center of each of the p, n active regions by a photolithography, and the Si oxide film 122 is removed by diluted hydrofluoric acid.

Figure 4A:
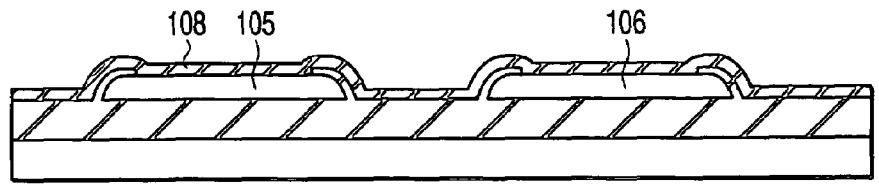
FIGS. 4A to 4D are sectional views of semiconductor structures in following processing steps of a method of manufacturing the semiconductor device of the first embodiment. Be sectional view showing manufacturing process of a semiconductor device of the first embodiment.
Figure 4B:
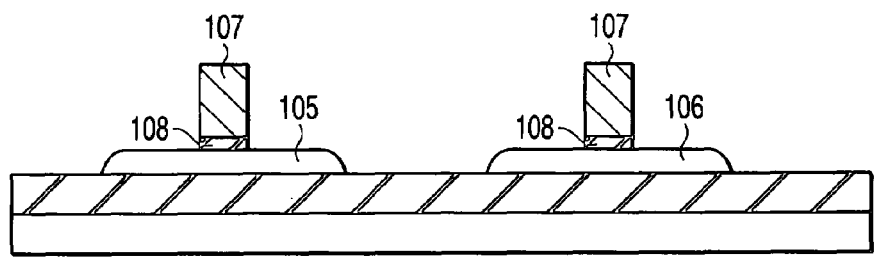

As shown in FIG. 4A, after the photoresist 152 is removed, a HfSiON gate insulating film 108 of 3 nm in thickness is deposited on the SOI layer 105 and the GOI layer 106 by sputtering.

As shown in FIG. 4 B, after a poly Si0.35Ge0.65 film of 100 nm in thickness is deposited on the gate insulating film 108, As ions and BF2 ions are implanted into the n and p channel regions, respectively. The polySi0.35Ge0.65 film is selectively etched by photolithography and RIE to form gate electrodes 107 of 20 nm in width.

Figure 4C:
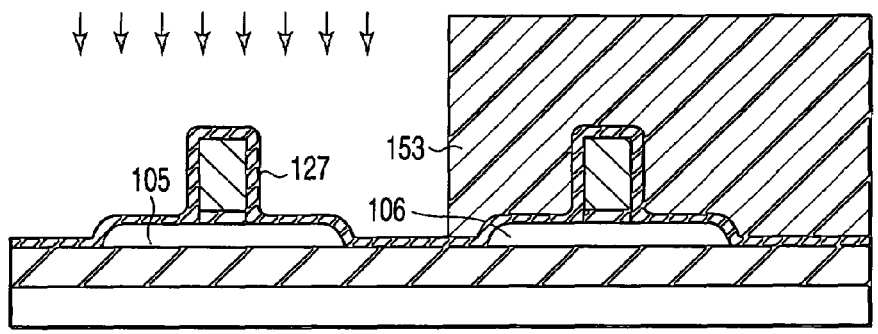
Figure 4D:
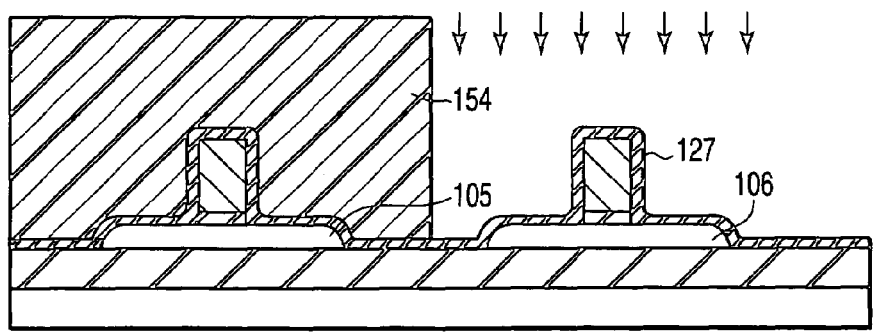

As shown in FIG. 4C, after a Si oxide film 127 of 5 nm in thickness is formed by CVD, As ions are implanted into the region for the nMISFET 10 to form n-type extension regions with the region for the pMISFET 20 being protected by a resist 153. Similarly, as shown in FIG. 4D, B ions are implanted into the region for the pMISFET 20 to form p-type extension regions with the region for the nMISFET 10 being protected by a resist 154.

Figure 5A:
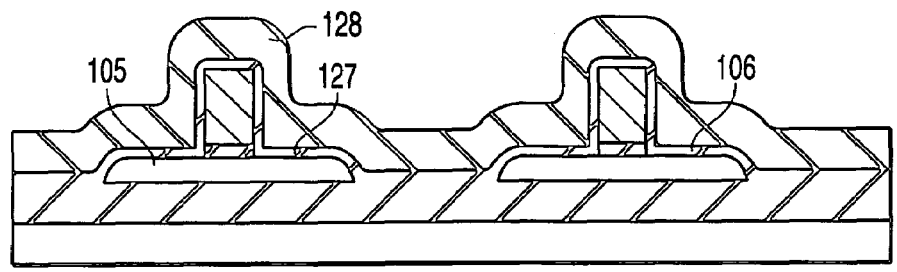
FIGS. 5A to 5D are sectional views of semiconductor structures in following processing steps of a method of manufacturing the semiconductor device of the first embodiment.
Figure 5B:
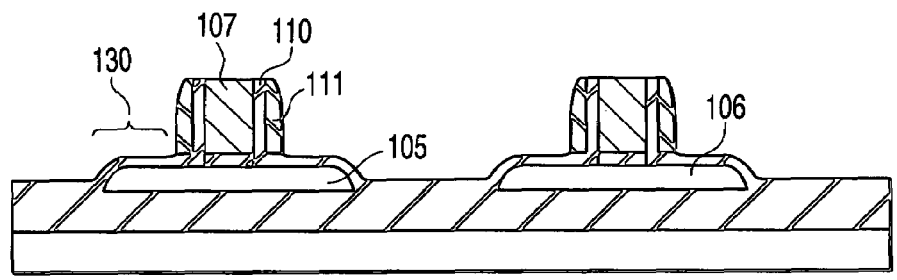

As shown in FIG. 5A, after removal of the resist 154, a Si nitride layer 128 of 20 nm in thickness is deposited on the Si oxide film 127 by CVD. As shown in FIG. 5B, the Si nitride layer 128 is etched back by RIE to form gate side wall insulating films 110 and 111.

Figure 5C:
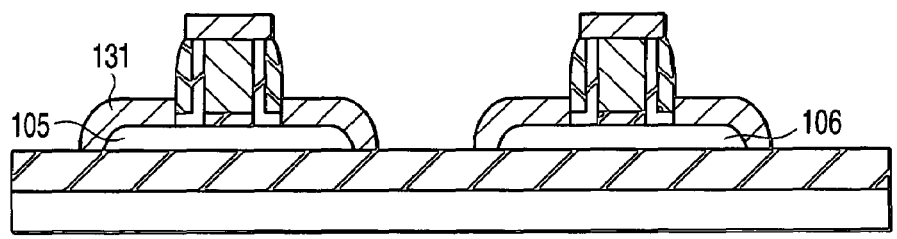

As shown in FIG. 5C, after the oxide film remained on the source and drain regions 130 is removed by diluted hydrofluoric acid, a Si0.35Ge0.65 layer 131 of 20 nm in thickness is epitaxially grown on the gate and the source and drain regions selectively. Subsequently, As ions and BF2 ions are implanted into the nMISFET and pMISFET regions, respectively, similarly to steps of FIGS. 4C and 4D, and then they are activated by annealing at 600° C. for five hours.

Figure 5D:
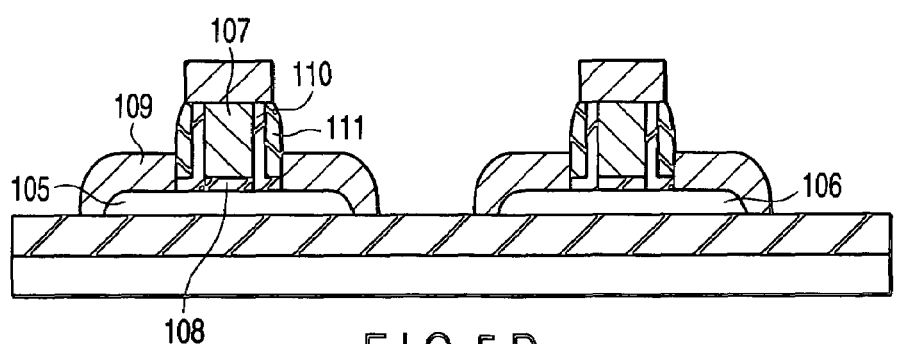

As shown in FIG. 5D, after Ni is deposited on the entire surface, it is annealed at 600° C. Thereafter, when unreacted Ni is etched by dilute hydrochloric acid, Ni(Si0.35Ge0.65) films 109 are formed on the top of the gate and the tops of the source and drain regions. Thereafter, an interlayer insulating film 112 and electrode 113 are formed to provide a structure shown in FIG. 1.

In this way, according to the present embodiment, the strained SOI layer 105 and strained GOI layer 106 are formed on the Si oxide film 102 so as to have substantially the same height, and nMISFET is fabricated on the strained SOI layer 105 and pMISFET is fabricated on the strained GOI layer 106. As a result, an integrated circuit device of a higher speed operation than the strained Si-CMOS can be realized. Further, the strained GOI layer 106 is a monolayer as well as the strained SOI layer 105, and comes in direct contact with the Si oxide film 102, so that a channel layer can be enough thinly formed to be 5 nm in thickness, for example. This is effective for the fully depleted operation that is a special feature of a SOI structure.

Second Embodiment

Figure 6:
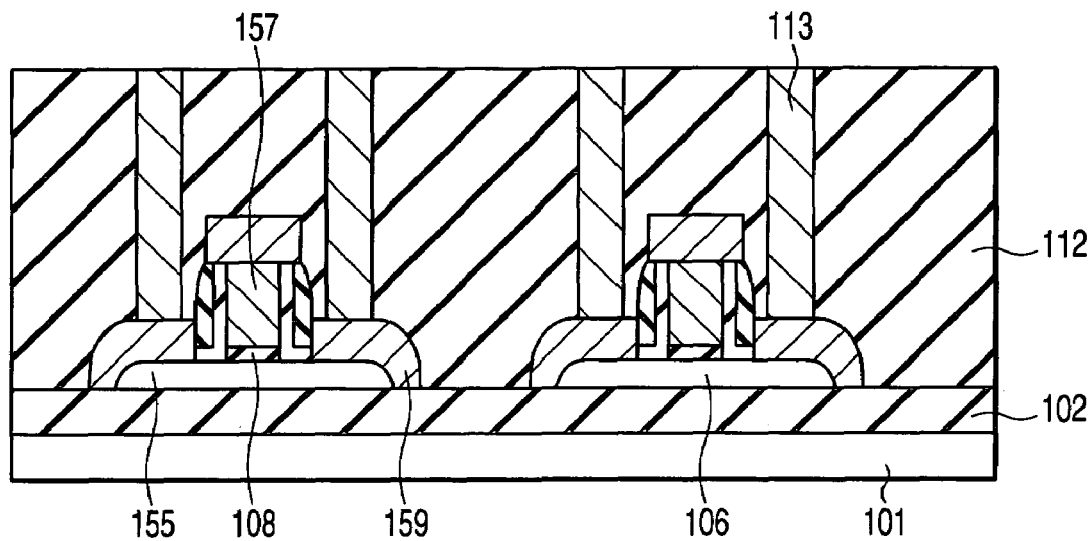
FIG. 6 is a schematic sectional view of a semiconductor device concerning a second embodiment of the present invention.

FIG. 6 is a schematic sectional view of a semiconductor device concerning the second embodiment of the present invention. In Second embodiment, like reference numerals are used to designate like structural elements corresponding to those like in First embodiment and any further explanation is omitted for brevity's sake.

The present embodiment uses a conventional SOI channel having no strain instead of the strained SOI channel in the first embodiment, and a SOI layer 155 instead of the strained SOI layer 105. Others are basically common to the first embodiment. However, a gate electrode 157 is formed of poly Si0.5Ge0.5, and a nickel germanium silicide film 159 on the gate and the source and drain regions is formed of Ni(Si0.5Ge0.5).

In the present embodiment, the starting substrate of the first embodiment is replaced by a conventional SOI substrate. Further, the Si0.35Ge0.65 layer for forming the germanium silicide film on the top of the gate and the tops of the source and drain regions is replaced by a Si0.5Ge0.5 layer.

Such a configuration allows realizing a high-speed operation of pMISFET with the strain GOI channel and provides the same effect as the first embodiment.

Third Embodiment

Figure 7:
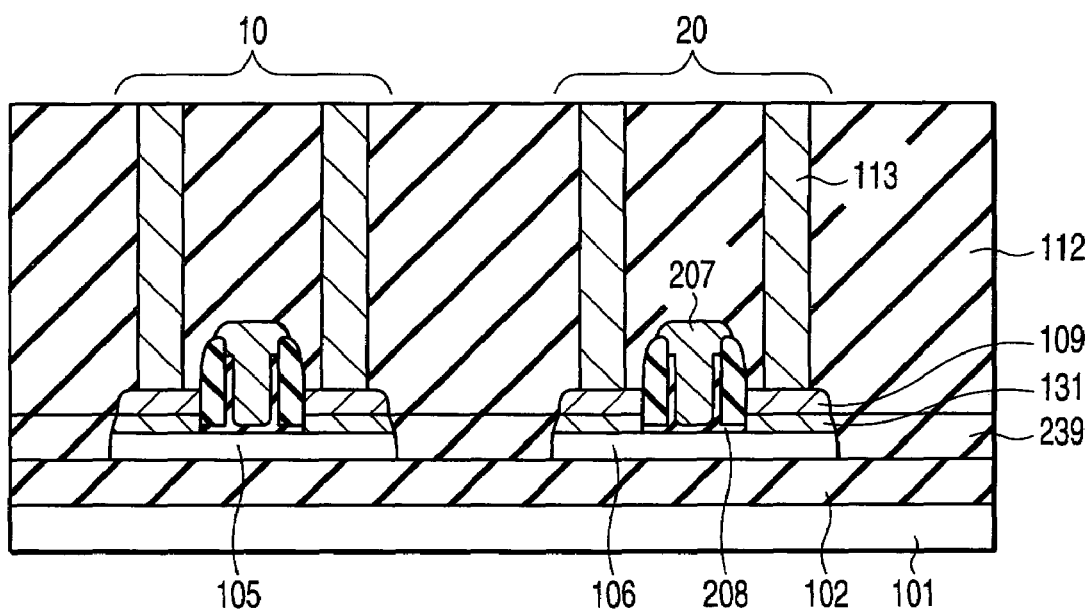
FIG. 7 is a schematic sectional view of a semiconductor device concerning a third embodiment of the present invention.

FIG. 7 is a schematic sectional view of a semiconductor device concerning the third embodiment of the present invention. In third embodiment, like reference numerals are used to designate like structural elements corresponding to those like in first embodiment and any further explanation is omitted for brevity's sake.

The present embodiment is common to the first embodiment in a basic structure, but differs from the first embodiment in that the whole of the gate electrode 207 is formed of germanium silicide (NiSiGe) and the gate insulating film 208 is formed of a HfON film. Further, a Si0.35Ge0.65 layer 131 and an Ni(Si0.35Ge0.65)) film 109 are laminated on source and drain regions. The manufacturing method is as follows.

In the present embodiment, gate depletion is suppressed by using metal germano-silicide for the gate electrode 207 to allow increasing a gate capacitance in comparison with a poly SiGe gate.

Fourth Embodiment

Figure 8:
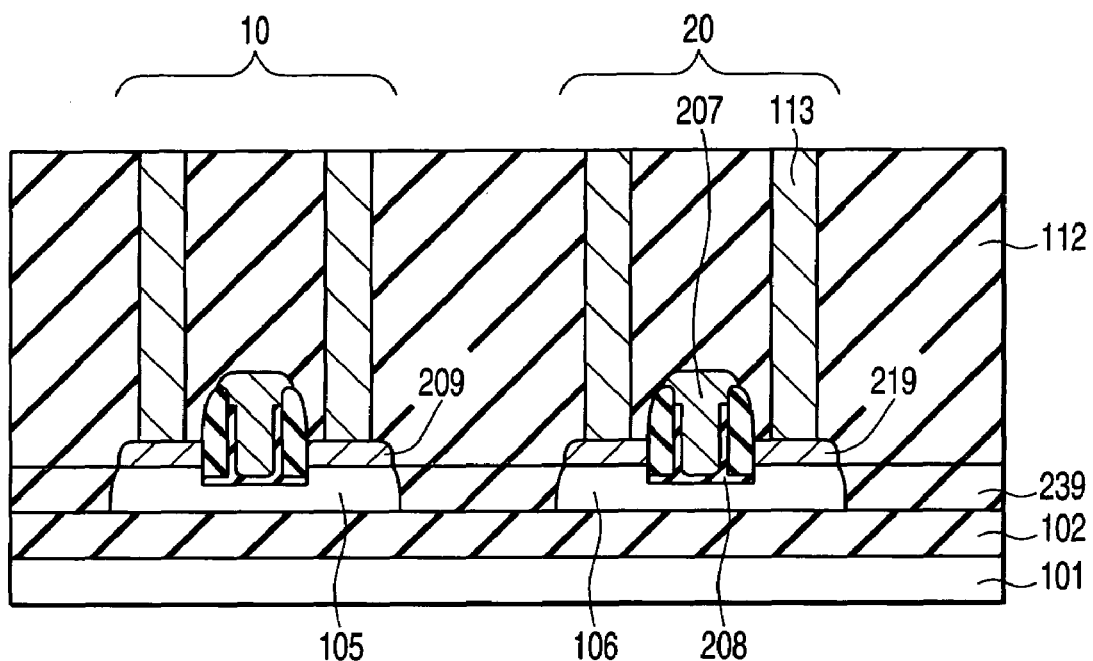
FIG. 8 is a schematic sectional view of a semiconductor device concerning a fourth embodiment of the present invention.

FIG. 8 is a schematic sectional view of a semiconductor device concerning the fourth embodiment of the present invention. In Fourth embodiment, like reference numerals are used to designate like structural elements corresponding to those like in First and Third embodiments and any further explanation is omitted for brevity's sake.

The present embodiment differs from the third embodiment in that silicide NiSi layers 209 are formed on source and drain regions of nMISFET, and germanide NiGe layers 219 are formed on source and drain regions of pMISFET. In the present embodiment, gate depletion is suppressed by using metal germano-silicide for the gate electrode 207 to allow increase of a gate capacitance in comparison with a poly SiGe gate.

A method of manufacturing a semiconductor device of the present embodiment will be described referring to FIGS. 9 to 12.

Figure 9A:
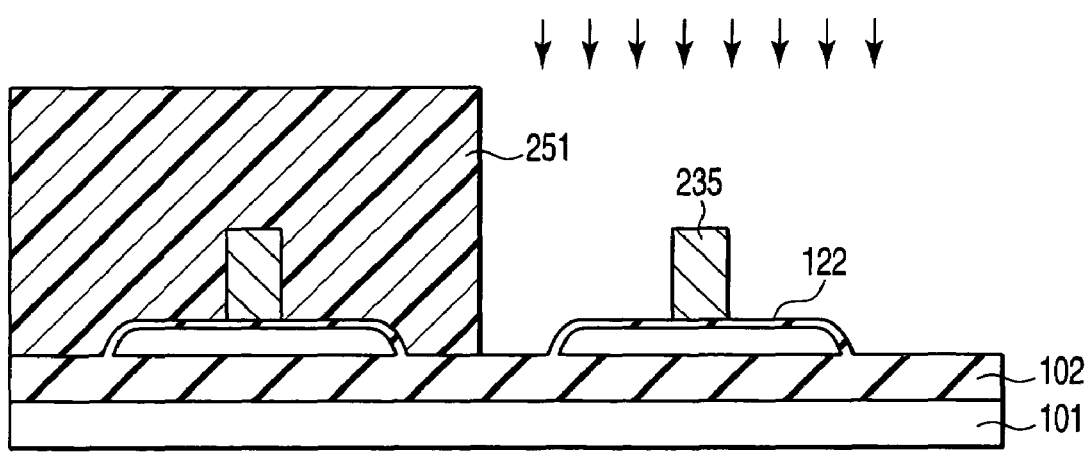
FIGS. 9A to 9D are sectional views of semiconductor structures in processing steps of a method of manufacturing the semiconductor device of the fourth embodiment.

The manufacturing method of the present embodiment is common to the first embodiment by halfway steps. In other words, after the step of FIG. 3C of the first embodiment, a poly Si dummy gate 235 is formed on an active region by lithography and RIE as shown in FIG. 9A. Further, a nMISFET region is protected by a resist 251, and B ions for extension of pMISFET are implanted into a pMISFET region. Similarly, the pMISFET region is protected by a resist 252, and As ions for extension of nMISFET are implanted into the nMISFET region.

Figure 9B:
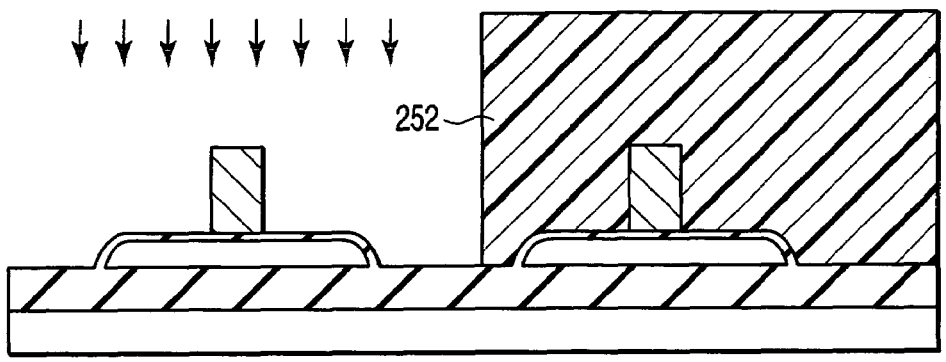
Figure 9C:
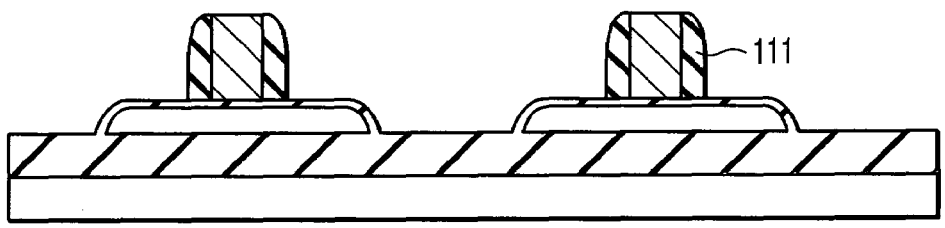
Figure 9D:
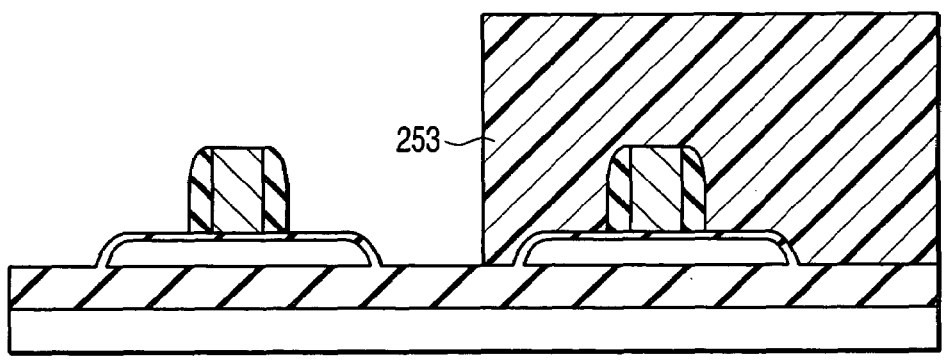

As shown in FIG. 9C, after a Si nitride film is deposited on the entire surface by a CVD method, it is etched back by a RIE method to form a Si nitride side wall 111. As shown in FIG. 9D, after the pMISFET region is protected by a resist 253, the oxide film 122 on the nMISFET is removed.

As shown in FIG. 10A, a Si layer 236 of 20 nm in thickness is selectively grown on the source and drain regions of the nMISFET and the dummy gate 235. As shown in FIG. 10B, a Si oxide film 237 of 5 nm in thickness is deposited on the entire surface by CVD.

As shown in FIG. 10C, the nMISFET region is protected by a resist 254, and the Si oxide film 237 on the pMISFET is removed by diluted hydrofluoric acid. As shown in FIG. 10D, after having removed the resist 254, a Ge layer 238 is epitaxially grown on the pMISFET region selectively. Thereafter, As and BF2 ions are implanted into the source and drain regions of the nMISFET and pMISFET, respectively, as shown in FIGS. 9A and 9B.

Figure 11A:
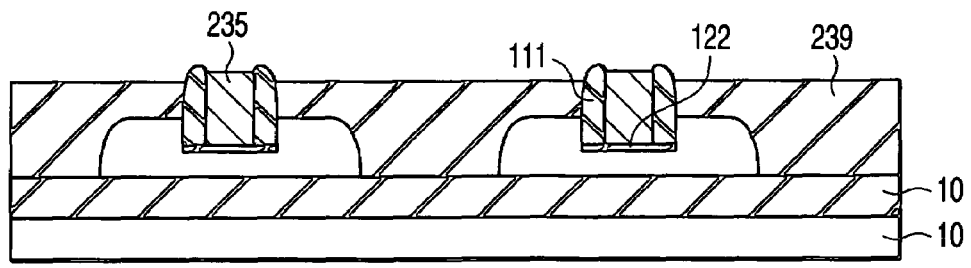
FIGS. 11A to 11D are sectional views of semiconductor structures in following processing steps of a method of manufacturing the semiconductor device of the fourth embodiment.
Figure 11B:
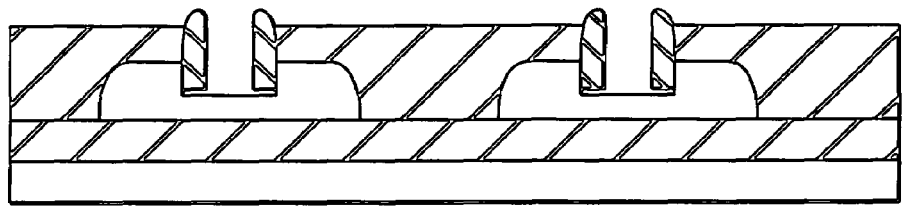

As shown in FIG. 11A, after having deposited on the entire surface a Si oxide film 239 of 100 nm in thickness, the Si oxide film 239 is flattened by a CMP method till the top of the side wall of the gate portion is exposed, and then an activation anneal is performed at 600° C. for five hours. As shown in FIG. 11B, the poly Si dummy gate 235 is etched by a CDE method, and the Si oxide film 122 is removed by diluted hydrofluoric acid to expose channel surfaces.

Figure 11C:
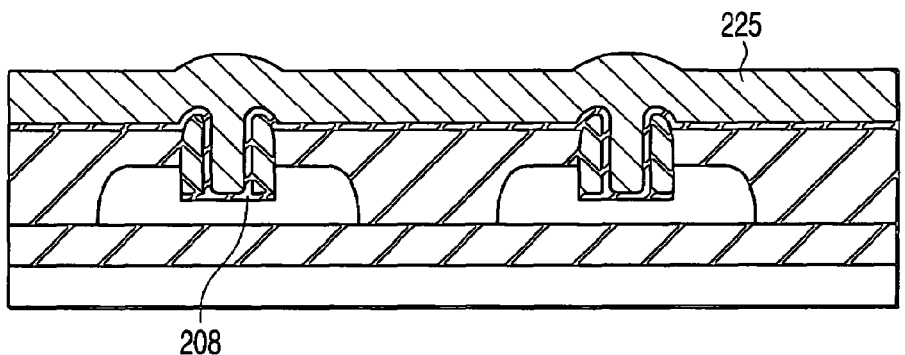
Figure 11D:
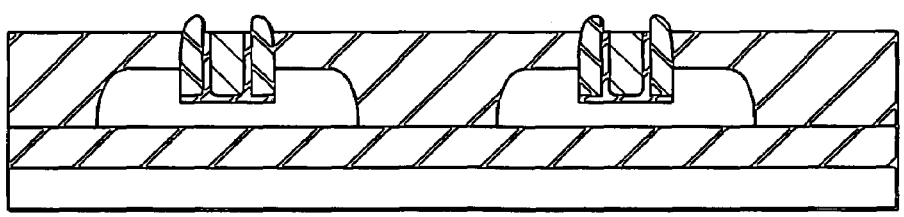

As shown in FIG. 11C, after having deposited a HfO2 film by MO-CVD method, a HfON gate insulating film 208 is formed by a nitrogen plasma process. Next, a poly Si0.35Ge0.65 film 225 is deposited on the HfON gate insulating film 208 to fill a hole after removing the dummy gate with the film 225. As shown in FIG. 11D, the entire surface is flattened by CMP method.

Subsequently, as shown in FIG. 12A, a Ni film 240 of 100 nm in thickness is deposited on the entire surface. As shown in FIG. 12B, annealing is done at 600° C. for one hour to make the entire of the poly SiGe film 225 into germano-silicide. When unreacted Ni is removed by hydrochloric acid, a gate electrode 207 made of germano-silicide remains.

As shown in FIG. 12C, after having etched the Si oxide film 239 by diluted hydrofluoric acid to expose the surface of the source and drain of the pMISFET, a Ni film 242 of 30 nm in thickness is deposited thereon again.

As shown in FIG. 12D, when annealing is done at 600° C. for 30 minutes and the unreacted Ni film 242 is removed by hydrochloric acid, the silicide layer 209 and germanide layer 219 remain on the source and drain regions of nMISFET and pMISFET respectively. Thereafter, an interlayer insulating film 112 and an electrode 113 are formed to make up a structure shown in FIG. 8.

In such a structure, gate depletion is suppressed by using metal germano-silicide for the gate electrode 207 to allow increase of a gate capacitance in comparison with a poly SiGe gate. Accordingly, the present embodiment provides an effect similar to that of the third embodiment.

In the third embodiment, Si0.35Ge0.65 layers may be formed simultaneously on the source and drain regions of the pMISFET and nMISFET in the processing steps of FIGS. 9D to 10D.

Fifth Embodiment

Figure 13:
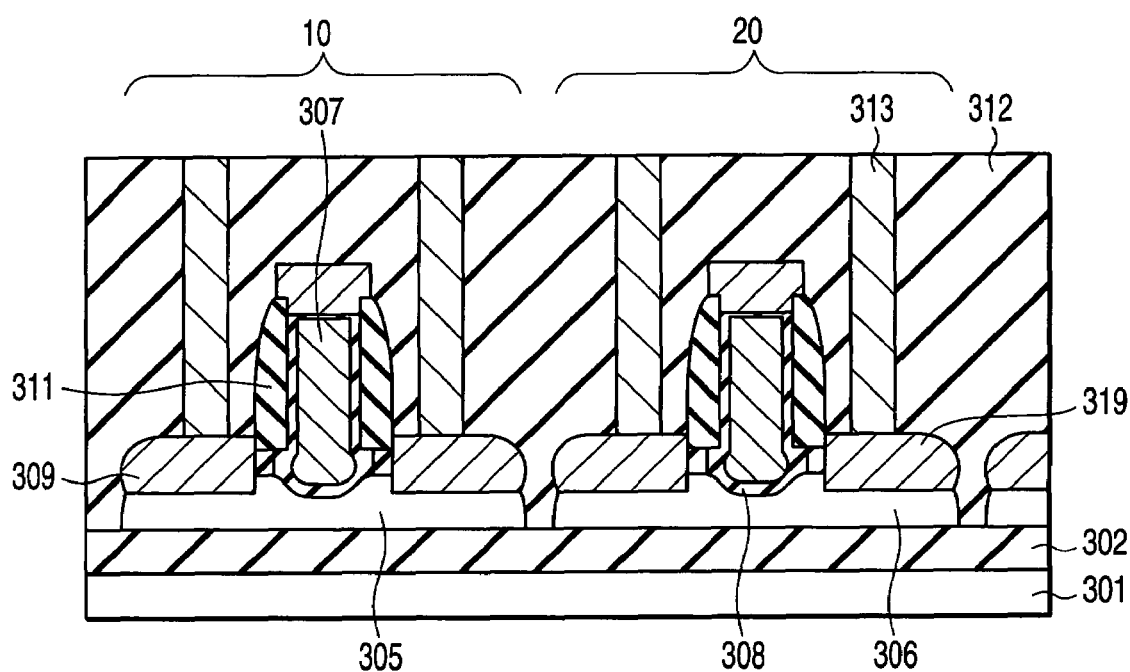
FIG. 13 is a schematic sectional view of a semiconductor device concerning a fifth embodiment of the present invention.

FIG. 13 is a schematic sectional view of a semiconductor device concerning the fifth embodiment of the present invention.

A silicon oxide film (insulating film) 302 of 50 nm in thickness is formed on the substrate 301. A strained Si layer (SOI layer) 305 is formed on one part of the silicon oxide 302 as a first semiconductor layer, and a strained SiGe (SGOI layer) 306 is formed on the other part as a second semiconductor layer. An n channel MISFET 10 is fabricated in the strained Si layer 305, and a p channel MISFET 20 is fabricated in the strained SiGe layer 306. In other words, FETs of a complementary type MIS structure are fabricated.

Gate electrodes 307 are formed on the strained Si layer 305 and the strained SiGe layer 306, respectively, with gate insulating films 308 interposed between the gate electrodes 307 and the strained Si layer 305 and the strained SiGe layer 306. Side wall insulating films 311 are formed on the side walls of the gate electrodes 307. Impurity ions were implanted into the strained Si layer 305 on both sides of the gate by ion implantation to form source and drain regions therein. Similarly, impurity ions are implanted into the strained SiGe layer 306 on both sides of the gate by ion implantation to form source and drain regions therein. In both MISFETs, the gate electrode 307 is formed of a poly Si0.35Ge0.65 film of 100 nm in height and 20 nm in width, and the gate insulating film 308 is formed of a HfON film of 3 nm in thickness. On the source and drain regions of the nMISFET 10 and pMISFET 20 are formed silicide NiSi films 309 and germano-silicide Ni(Si0.8Ge0.2) film 319 are formed respectively. An interlayer insulating film 312 is formed of a Si oxide film and the like and a wiring electrode 313 is formed of Al.

In the present embodiment, the channel portion of the nMISFET is formed of the strained SOI layer 305, and the channel portion of the pMISFET is formed of the strained SGOI layer 306. The channel portion has the minimum thickness of 5 nm at its center and becomes thicker as nearing the source and drain regions. In the pMISFET, Ge composition is 100% in the thinnest center, decreases as nearing the source and drain regions, and 20% in the source and drain regions.

A method of manufacturing a semiconductor device of the present embodiment is described in conjunction with FIGS. 14A to 17D hereinafter.

Figure 14A:
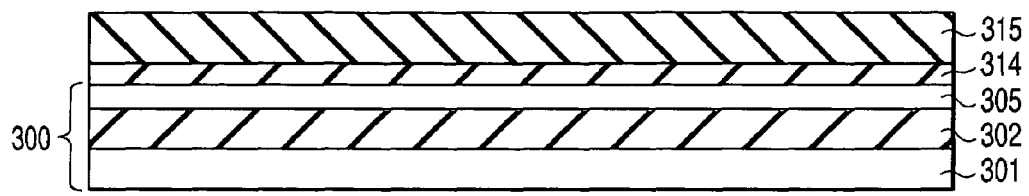
FIGS. 14A to 14D are sectional views of semiconductor structures in processing steps of a method of manufacturing the semiconductor device of the fifth embodiment.

As shown in FIG. 14A, there is prepared a strained SOI substrate 300 comprising a Si substrate 301, a Si oxide film 302 on the substrate 301 and a Si layer (SOI layer) 305 of 7.5 nm in thickness formed on the Si oxide film 302. A Si oxide film 314 of 5 nm in thickness is formed on the strained SOI substrate 300 by thermal oxidation and further a Si nitride film 315 of 20 nm in thickness is deposited on the Si oxide film 314 by CVD.

Figure 14B:
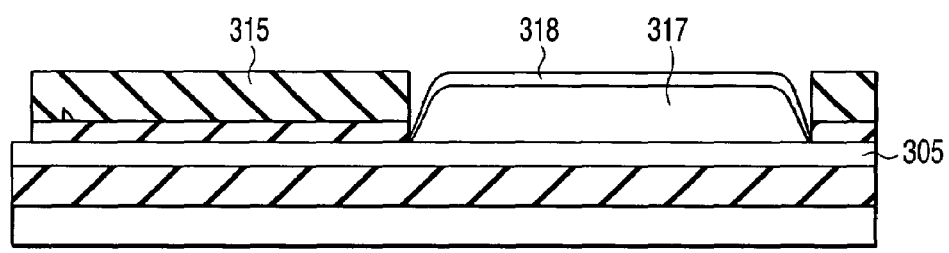

As shown in FIG. 14B, an opening for a region for forming the pMISFET is formed in the Si nitride 315 by a photolithography and RIE method, and the Si oxide film 314 on the opening is removed by diluted hydrofluoric acid. Subsequently, a Si0.75Ge0.25 film 317 of 20 nm in thickness and a Si film 318 of 3 nm in thickness are epitaxitially grown selectively on the strained SOI layer 305 exposed by the opening of the Si nitride 315.

Figure 14C:
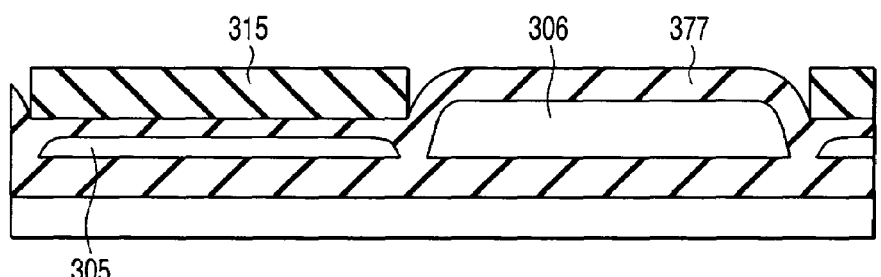

As shown in FIG. 14C, a Si oxide film 377 of 5 nm in thickness is formed on the surface of the Si/SiGe layer by thermal oxidation of 1100° C. The interface between the Si and SiGe layers is vanished by interdiffusion of Si and Ge, and Si0.8Ge0.2 layer (SGOI layer) 306 of 25 nm in thickness with almost uniform composition is formed.

Figure 14D:
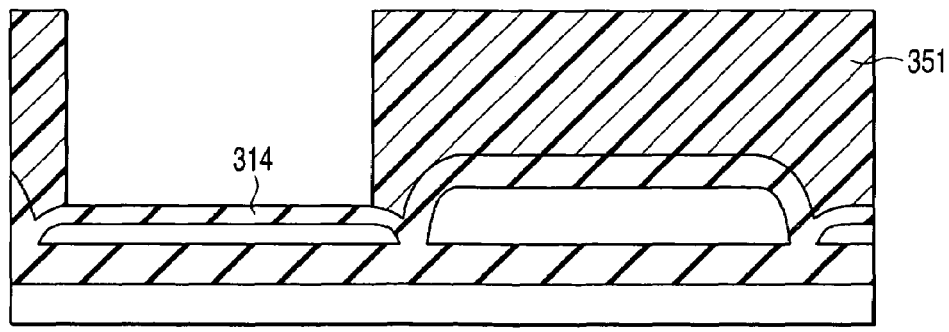

As shown in FIG. 14D, after having formed a resist 351, an opening is formed in the part of the resist 351 that corresponds to the nMISFET region by photolithography.

Figure 15A:
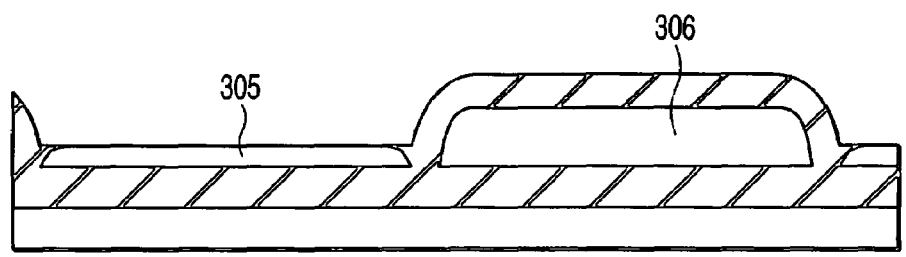
FIGS. 15A to 15D are sectional views of semiconductor structures in following processing steps of a method of manufacturing the semiconductor device of the fifth embodiment.
Figure 15B:
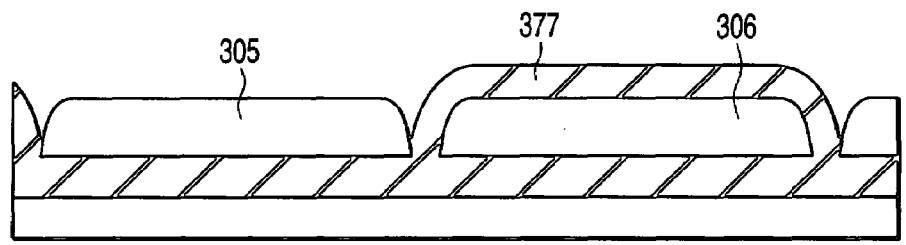

As shown in FIG. 15A, the Si oxide film 314 on the nMISFET region 20 is removed by diluted hydrofluoric acid. Subsequently, the resist 351 is removed. As shown in FIG. 15B, a Si layer 305 is epitaxially grown on the exposed Si surface selectively so as to have the same thickness of 25 nm as that of the SiGe layer 306 of the pMISFET region.

Figure 15C:
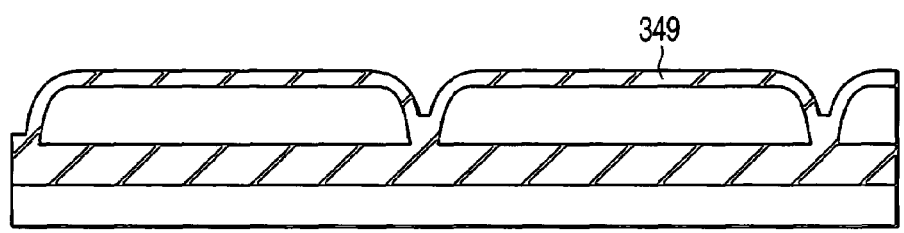

As shown in FIG. 15C, after having removed the Si oxide film 377 on the pMISFET region by diluted hydrofluoric acid, a Si oxide film 349 of 3 nm in thickness is deposited over the layers 305 and 306. Thereafter, B and As ions are implanted into the n and p channel regions respectively.

Figure 15D:
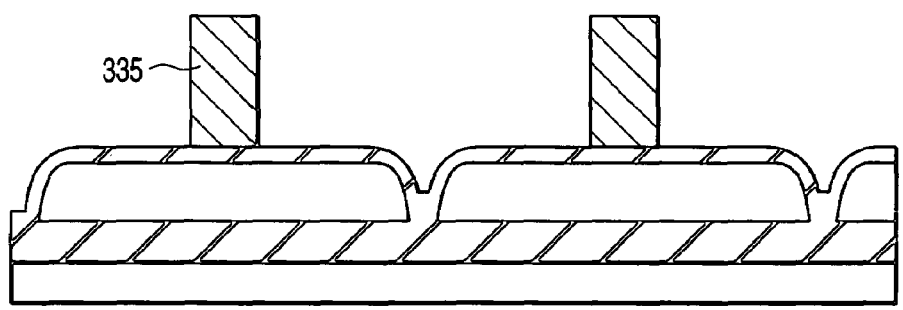

As shown in FIG. 15D, after having deposited a poly Si film of 100 nm in thickness by a CVD method, a dummy gate 335 is formed on the Si oxide film 349 by photolithography and RIE.

As shown in FIG. 16A, after having deposited a Si nitride film of 20 nm in thickness on the entire surface, the Si nitride film is etched by RIE to form a side wall insulating film 311. A Si oxide film 339 is deposited on the entire surface in a CVD method and flattened by a CMP method to expose the top of the dummy gates 335.

As shown in FIG. 16B, the dummy gates 335 are etched and removed by a CDE method, and Ge composition of the SiGe layer 305 right under the opening is increased by the condensation method. In this time, the SiGe layer 306 right under the opening is prevented from being melted by performing thermal oxidation while decreasing the temperature to 1100° C., 1000° C., 900° C. step by step. As shown in FIG. 16C, a Si oxide film 352 is formed on the SiGe layer 306, and when the thinnest portion of the SiGe layer 306 becomes 5 nm and the SiGe layer is condensed into pure Ge, the oxidation is stopped.

As shown in FIG. 16D, a thermal oxidation film 352 on the opening is removed by diluted hydrofluoric acid to expose the surface of the SiGe layer.

Figure 17A:
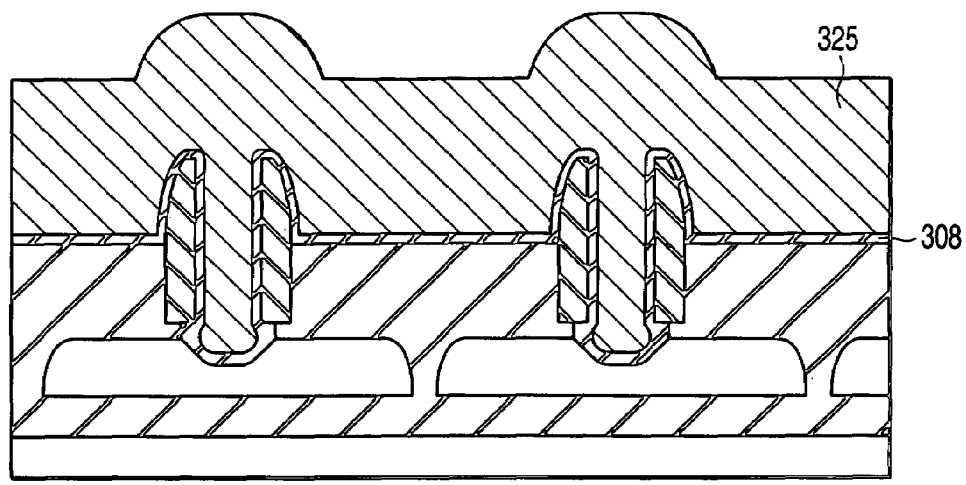
FIGS. 17A to 17D are sectional views of semiconductor structures in following processing steps of a method of manufacturing the semiconductor device of the fifth embodiment.

As shown in FIG. 17A, after having deposited a HfO2 film by a MO-CVD method, a HfON gate insulating film 308 of 3 nm in thickness is formed by a nitrogen plasma process. A poly Si0.35Ge0.65 film 325 is deposited on the HfON gate insulating film 308 to fill a hole after removal of dummy gate. As a result, a gate electrode 307 is formed.

Figure 17B:
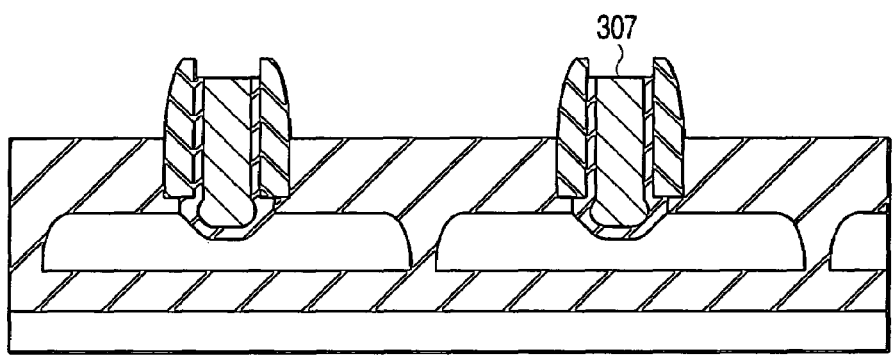

As shown in FIG. 17B, the HfON gate insulating film 308 and poly SiGe film 325 are removed except for the gate portions by a CDE method.

Figure 17C:
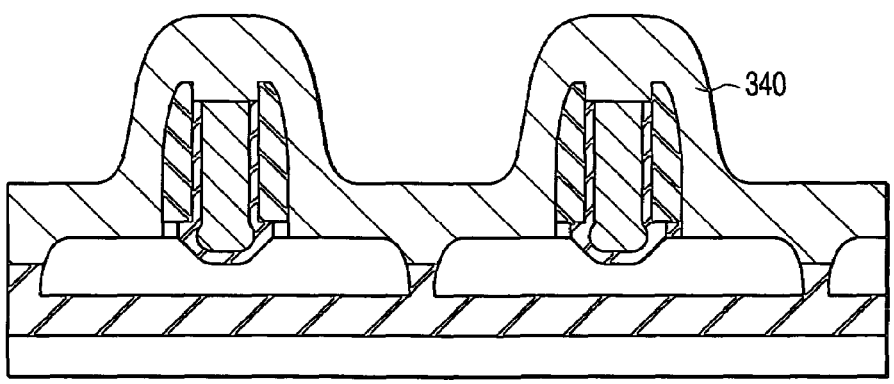

As shown in FIG. 17C, one part of the Si oxide film is removed by a RIE method and the surfaces of the source and drain regions are exposed by diluted hydrofluoric acid. Thereafter, a Ni film 340 is deposited on the entire surface.

Figure 17D:
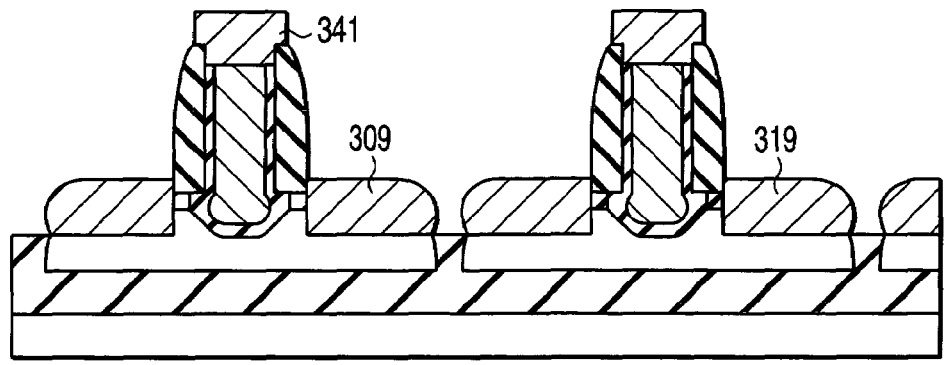

As shown in FIG. 17D, annealing is performed at 600° C. for 30 minutes to form germano-silicide Ni(Si0.8Ge0.2) films 319 on the source and drain of the pMISFET, germano-silicide Ni(Si0.35Ge0.65) films 341 on the tops of the gates, and silicide NiSi films 309 on the source and drain of nMISFET. Thereafter, the unreacted Ni film 340 is removed.

After this step, the interlayer insulating film 312 and electrode 313 are formed on the semiconductor structure of FIG. 17D to provide an integrated circuit device of the structure shown in FIG. 13.

In such a configuration, the integrated circuit device realizes a high speed operation with the strained SGOI of the pMISFET, and provides the same effect as that of the first embodiment.

Sixth Embodiment

Figure 18:
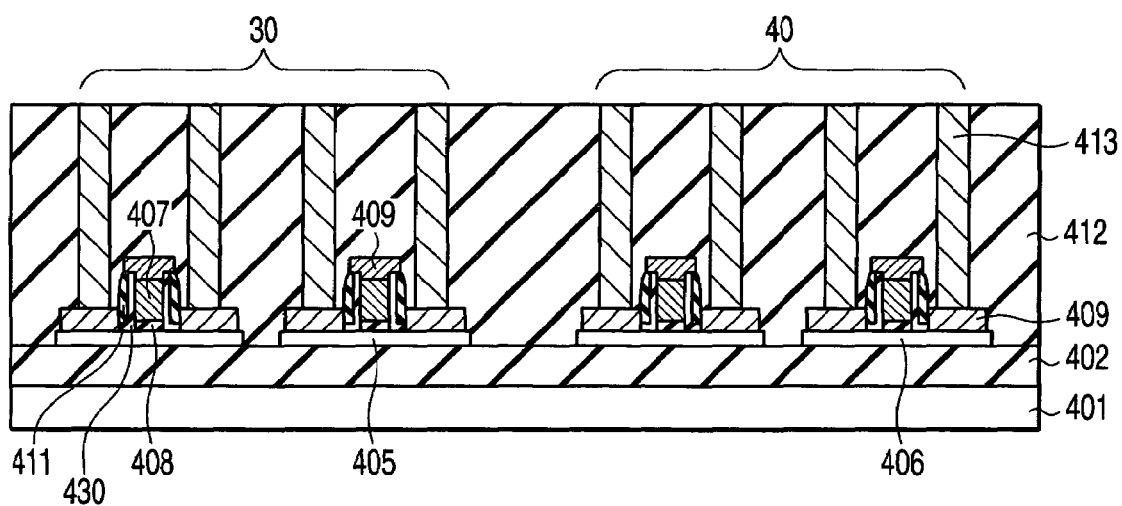
FIG. 18 is a schematic sectional view of a semiconductor device concerning a sixth embodiment of the present invention.

FIG. 18 is a schematic sectional view of a semiconductor device concerning the sixth embodiment of the present invention.

The previous embodiments use a SOI layer or a strained SOI layer as an n channel, and use a SGOI layer or a GOI layer as a p channel. However, in the present embodiment, the channel of the CMISFET of a high-speed logic unit in an integrated circuit, for example, a CPU circuit block 40 is formed of a strained GOI layer 406, and the channel of the CMISFET of other circuitry block, for example, an interface circuit block 30 is formed of a strained SOI layer 405.

In the present embodiment, the gate electrodes of both blocks each have a layered structure of a poly SiGe layer 407 and a germano-silicide Ni(Si0.35Ge0.65) film 409, and the gate insulating film 408 is formed of a HfSiON film of 3 nm in thickness. The channels under the gates each are 5 nm thick. On the other hand, the gate length of the CMISFET of the interface circuit block 30 is 50 nm and the gate length of CMISFET of the CPU circuitry block 40 is 20 nm. The source and drain of the CMISFET of the CPU circuitry block 40 has a layered structure of the GOI 406 and the germano-silicide Ni(Si0.35Ge0.65) film 409, and the source and drain of the CMISFET of the interface circuit block 30 has a layered structure of the Si layer 405 and the germano-silicide Ni(Si0.35Ge0.65) film 409.

A method of manufacturing a semiconductor device of the present embodiment will be described referring to FIGS. 19A to 20E.

Figure 19A:
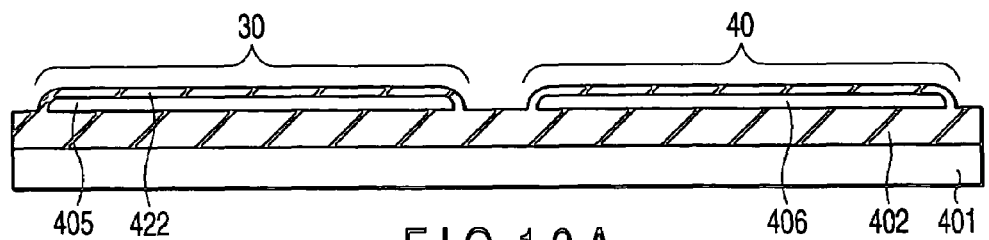
FIGS. 19A to 19E are sectional views of semiconductor structures in processing steps of a method of manufacturing the semiconductor device of the sixth embodiment.

As shown in FIG. 19A, the strained SOI layer 405 for the interface circuit block 30 and the strained GOI layer 406 for the CPU circuit block 40 are formed according to the same processing steps as FIGS. 2A to 3C. Each of the SOI and GOI layers is 5 nm thick. A Si oxide film 422 of 3 nm in thickness is deposited over the surfaces of the strained SOI layer 405 and the strained GOI layer 406.

Figure 19B:
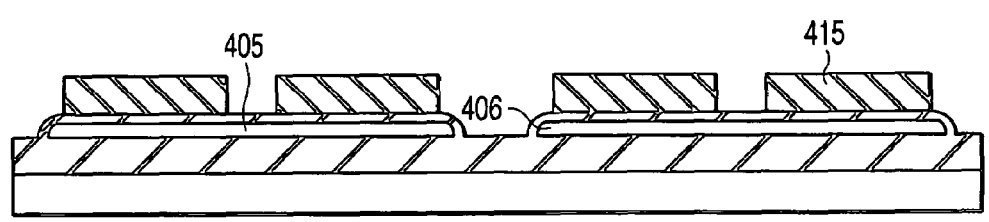
Figure 19C:
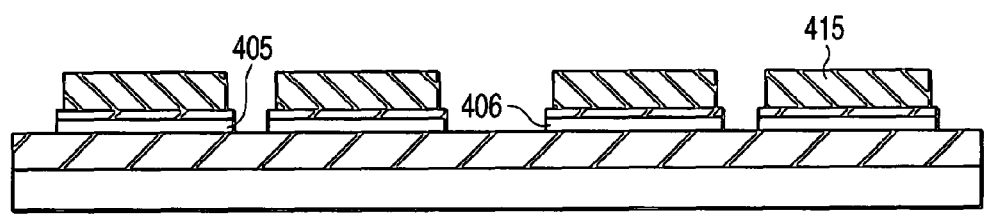

As shown in FIG. 19B, a Si nitride of 20 nm in thickness is deposited on the entire surface, and a mask 415 for device separation is formed by a photolithography and RIE method. As shown in FIG. 19C, the Si oxide film 422, the strained SOI layer 405 and the strained GOI layer 406 are selectively etched by a RIE method. Thereafter, the Si nitride mask 415 is etched back by CDE method.

Figure 19D:
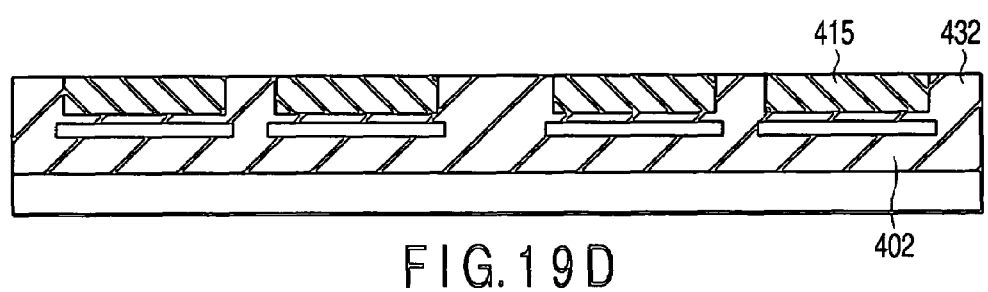
Figure 19E:
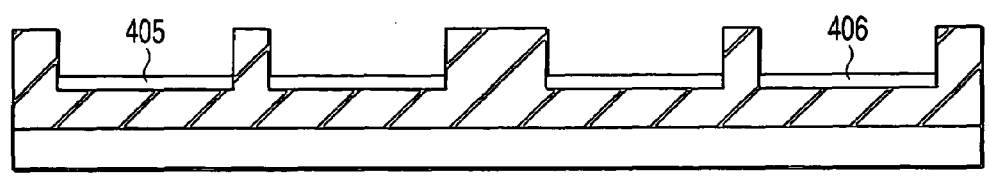

As shown in FIG. 19D, after having deposited a Si oxide film 432 of 30 nm in thickness on the entire surface, it is flattened by a CMP method to expose the mask 415 for device separation. As shown in FIG. 19E, the Si nitride mask 415 is removed by a CDE method, and B and As ions are implanted in the n-channel regions and p-channel regions, respectively, and further the oxide film 422 is removed by diluted hydrofluoric acid to expose the surfaces of the strained SOI layer 405 and strained GOI layer 406.

Figure 20A:
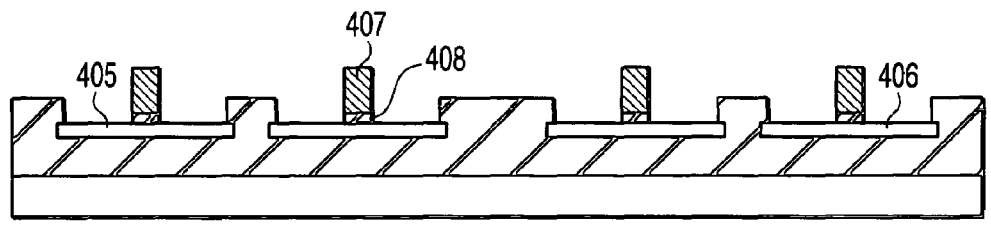
FIGS. 20A to 20E are sectional views of semiconductor structures in following processing steps of a method of manufacturing the semiconductor device of the sixth embodiment.

As shown in FIG. 20A, a HfSiON gate insulating film 408 of 3 nm in thickness and a poly Si0.35Ge0.65 gate 407 of 80 nm in thickness. Next, the gate is patterned by a photolithography and RIE method. As and BF2 ions are implanted in extension regions of the n and p channel regions, respectively.

Figure 20B:
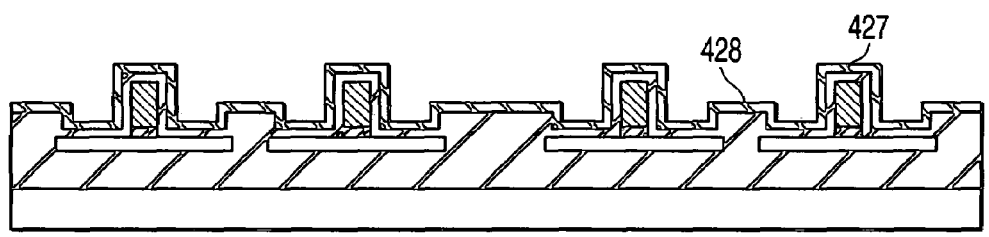
Figure 20C:
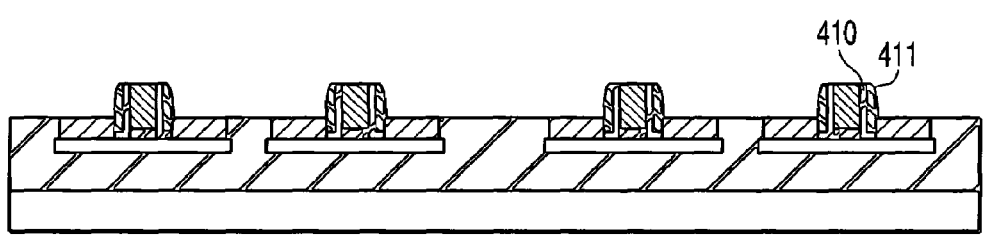

As shown in FIG. 20B, after having deposited a Si oxide film 427 and a Si nitride 428 on the entire surface, gate side walls 410 and 411 are formed by etching back them by a RIE method, as shown in FIG. 20C.

Figure 20D:
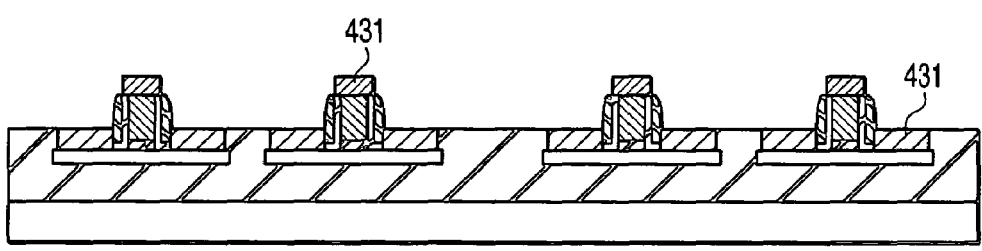

As shown in FIG. 20D, after having removed the oxide film remaining on the source and drain region, a Si0.35Ge0.65 film 431 of 15 nm in thickness is epitaxially grown on the exposed source and drain portion selectively, and As and BF2 ions are implanted in the source and drain regions in the n-channel regions and p-channel regions, respectively.

Figure 20E:
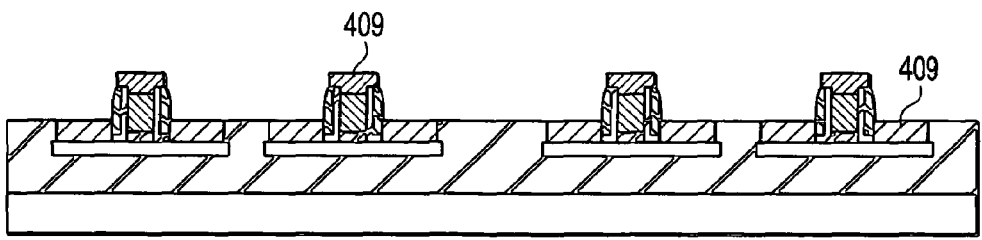

As shown in FIG. 20E, after have formed an Ni film on the entire surface, annealing is performed at 600° C. to form germano-silicide Ni(Si0.35Ge0.65) films 409 on the source and drain regions and the top of the gate. Thereafter, a unreacted Ni film is removed by dilute hydrochloric acid.

After this step, an interlayer insulating film 412 and an electrode 413 are formed on the semiconductor structure of FIG. 20E to provide the structure shown in FIG. 18.

In this way according to the present embodiment, the strained SOI layer 405 and strained GOI layer 406 are formed on the insulating film 402 to have substantially the same height. The interface circuit block 30 is fabricated in the strained SOI layer 405, and the CPU circuitry block 40 is fabricated in the strained GOI layer 406. In other words, a device requiring a low power operation and a low stand-by power operation such as LOP-MOSFET or LSP-MOSFET can be fabricated in the strained SOI layer 405. A device requiring a high-speed operation such as HP-MOSFET can be fabricated in the strained GOI layer 407. The low power operation and low stand-by power operation are achieved in the interface circuit block 30, and the high-speed operation is achieved in the CPU circuit block 40. Accordingly, an integrated circuit device with both high-speed operation and low power operation can be realized.

Seventh Embodiment

Figure 21:
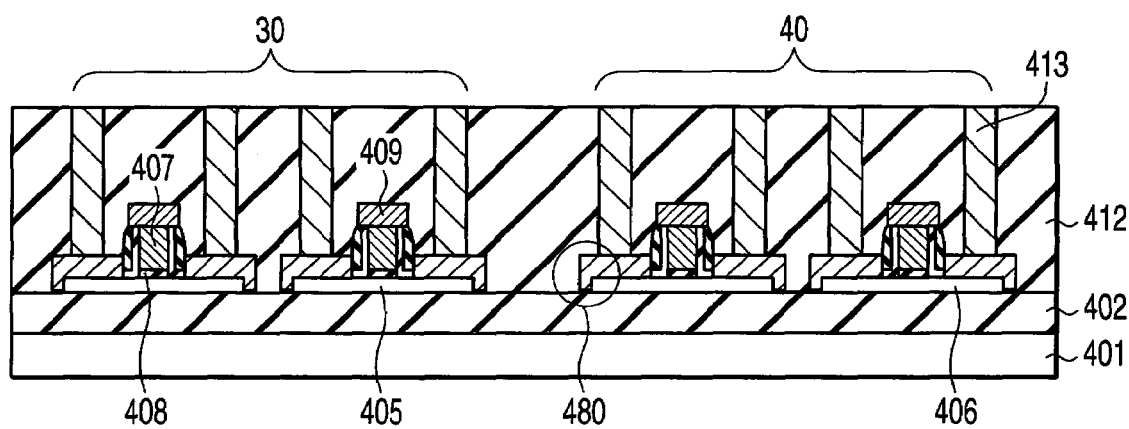
FIG. 21 is a schematic sectional view of a semiconductor device concerning a seventh embodiment of the present invention.

FIG. 21 is a schematic sectional view of a semiconductor device concerning the seventh embodiment of the present invention. In Seventh embodiment, like reference numerals are used to designate like structural elements corresponding to those like in Sixth embodiment and any further explanation is omitted for brevity's sake.

The present embodiment is same as the sixth embodiment in basic configuration, but differs therefrom in a structure of a device isolation edge 480 due to a different manufacturing method. In other words, a germano-silicide Ni(Si0.35Ge0.65) film 409 is formed on the side of the isolation edge 480.

A method of manufacturing a semiconductor device of the present embodiment will be described referring to FIGS. 22A to 23C.

Figure 22A:
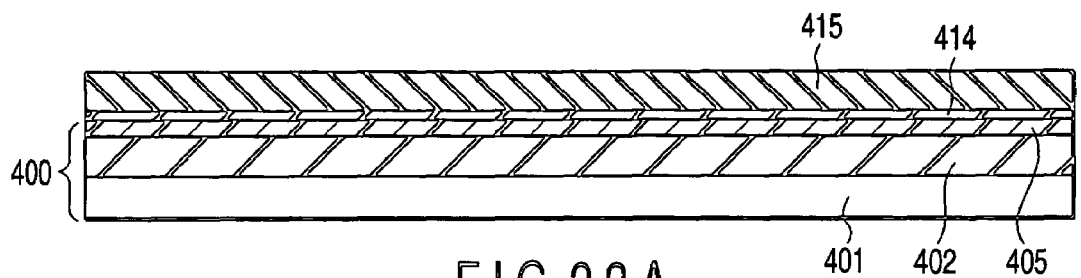
FIGS. 22A to 22D are sectional views of semiconductor structures in processing steps of a method of manufacturing the semiconductor device of the seventh embodiment.

As shown in FIG. 22A, there is prepared a strained SOI substrate 400 wherein a strained Si layer (SOI layer) 405 of 5 nm in thickness is disposed over a Si substrate 401 with a silicon oxide 402 interposed between the Si substrate 401 and the strained Si layer 405. A Si oxide film 414 of 5 nm in thickness is formed on the SOI layer 405 by thermal oxidation. Further, a Si nitride film 415 of 20 nm in thickness is deposited on the Si oxide film 414 by CVD.

Figure 22B:
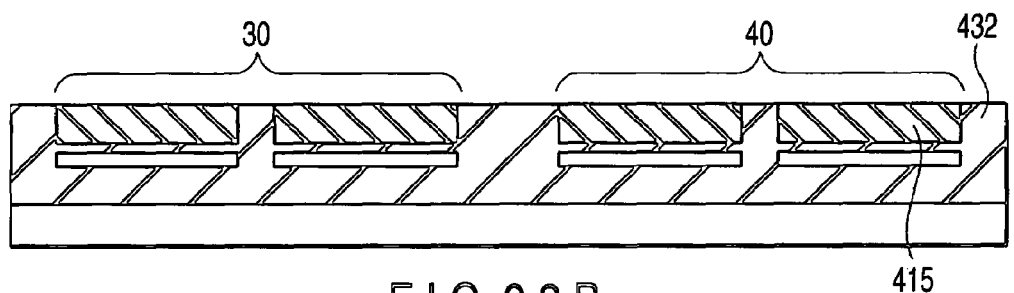
Figure 22C:
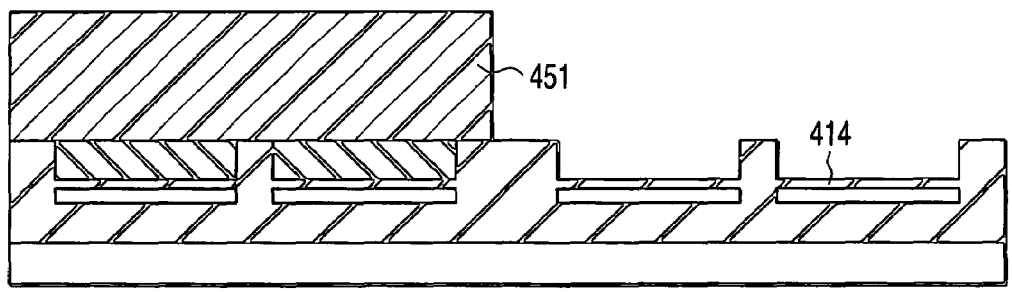

As shown in FIG. 22B, the Si nitride mask 415 is buried in a Si oxide film 432 and flattened similarly to FIGS. 19B and 19C. As shown in FIG. 22C, an interface circuit block region 30 is protected by a resist 451, and the Si nitride mask 415 of a CPU circuit block 40 is removed by a CDE method.

Figure 22D:
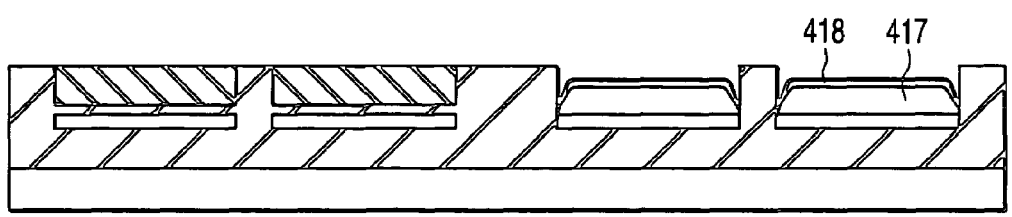

As shown in FIG. 22D, after having removed the resist 451, the Si oxide film 414 is removed by diluted hydrofluoric acid, and a Si0.8Ge0.2 layer 417 of 25 nm in thickness and a Si layer 418 of 5 nm in thickness are formed on the strained Si layer 405 by selective epitaxial growth.

As shown in FIG. 23A, the GOI layer 406 of 5 nm in thickness is formed on the high-speed logic circuit block 40 by the condensation method, and flattened by a CMP method.

As shown in FIG. 23B, after having removed the remaining Si nitride mask 415 by a CDE method, the oxide film 432 is removed by diluted hydrofluoric acid. As shown in FIG. 23C, after having deposited a Si oxide film 422 of 3 nm in thickness on the entire surface by a CVD method, B and As ions are implanted into n and p channel regions, respectively.

After this step, processing steps shown in FIGS. 3D to 5D are performed to provide a structure shown in FIG. 21. Because the SOI layer 405 and GOI layer 406 are protruded from the substrate surface unlike FIG. 19E, a germano-silicide Ni(Si0.35Ge0.65) film 409 is formed on the side of the device isolation edge 480.

Such a configuration provides the same effect as the sixth embodiment. Besides, because the germano-silicide Ni(Si0.35Ge0.65) film 409 is formed on the side of the device isolation edge 480, too, an effect to reduce a leakage current from the device separation edge is provided.

FIG. 24 is a schematic sectional view of a semiconductor device concerning the eighth embodiment of the present invention.

The present embodiment comprises a memory circuit block 50 configured by CMISFETs each having a channel of bulk Si layer 561, an interface circuit block 30 configured by strained SOI-CMISFETs, and a CPU circuit block 40 configured by strained GOI-CMISFETs.

A layered structure of a gate portion is common to all devices, a gate insulating film is formed of a HfSiON film 508 of 3 nm in thickness, and a gate electrode has a layered structure of a germano-silicide Ni(Si0.35Ge0.65) film 509 and a poly Si0.35Ge0.65 film 507. The side wall structure of the gate is common to all devices and comprises a Si oxide film 510 of 10 nm in thickness and a Si nitride film 511 of 10 nm in maximum thickness. The gate length is 60 nm in the memory circuit block 50, 40 nm in the interface circuit block 30, and 20 nm in the CPU circuitry block 40. The film thickness of the channel portion of strained SOI and strain GOI films each are 5 nm. The source and drain portions each have an elevated structure, and a germano-silicide Ni(Si0.35Ge0.65) film 509 is formed on the poly Si0.35Ge0.65 film 507.

A method of manufacturing a semiconductor device of the present embodiment will be described referring to FIGS. 25A to 26E.

As shown in FIG. 25A, there is prepared a strained SOI substrate 500 wherein a strained Si layer (SOI layer) 505 of 5 nm in thickness is disposed over a Si substrate 501 with a silicon oxide 502 interposed between the Si substrate 501 and the strained Si layer 503. As shown in FIG. 25B, a Si oxide film 514 of 5 nm in thickness is formed on the SOI layer 503 by thermal oxidation, and a Si nitride film 515 of 20 nm in thickness is deposited on the Si oxide film 514 by CVD.

Figure 25C:
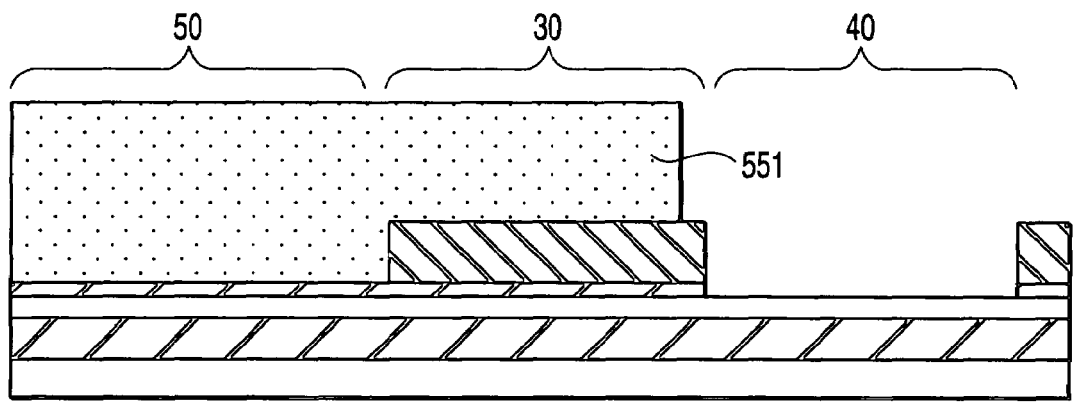

As shown in FIG. 25C, the Si nitride mask 515 of the memory circuit block region 50 and CPU circuitry block 40 is removed by a CDE method, the memory circuit block region 50 and interface circuit block 30 are protected by a resist 551, and the Si oxide film 514 of the CPU circuit block 40 is removed by diluted hydrofluoric acid.

Figure 25D:
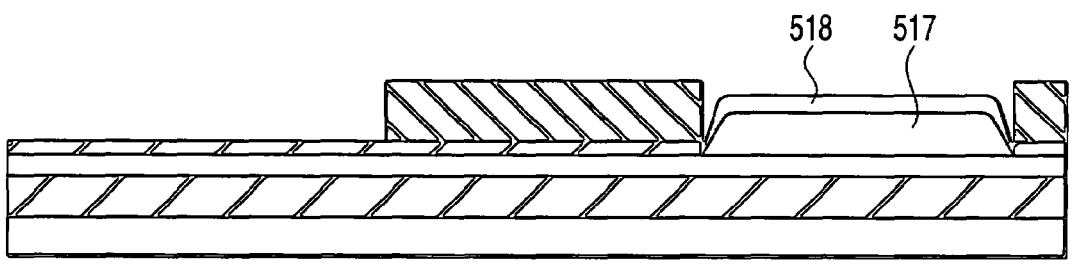

As shown in FIG. 25D, a Si0.75Ge0.25 layer 517 of 20 nm in thickness and a Si layer 518 of 5 nm in thickness are epitaxially grown on the CPU circuitry block 40 selectively.

Figure 25E:
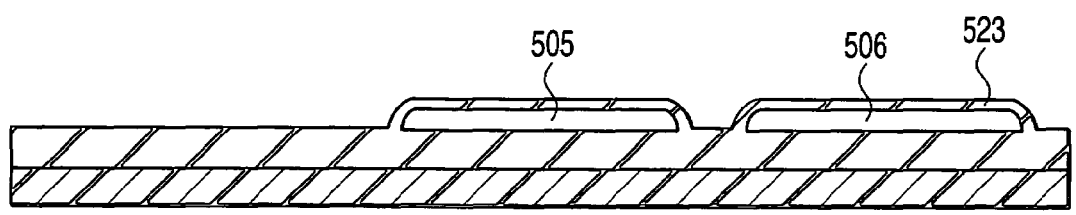

As shown in FIG. 25E, a strained SOI layer 505 of 5 nm in thickness is formed on the interface circuit block 30 and a strained GOI layer 506 of 5 nm in thickness is formed on the CPU circuitry block 40, according to the processing steps of FIGS. 3A to 3C. After having deposited a Si oxide film 523 of 3 nm in thickness on the entire surface by a CVD method, B and As ions are implanted into the n and p channel regions, respectively.

Subsequently, as shown in FIG. 26A, the strained SOI layer 505 and strained GOI layer 506 are protected by a resist 552, and the surface of a Si substrate of the memory circuit block 50 is exposed by a RIE method and diluted hydrofluoric acid etching.

As shown in FIG. 26B, after having removed the resist, a Si layer 561 is selectively grown on the exposed surface of the substrate. After having removed the Si oxide film 523 once, a Si oxide film 522 is deposited on the entire surface by CVD method. A grown Si layer 561 is prepared to have the same height as that of the strained SOI layer 505 and strained GOI layer 506.

As shown in FIG. 26C, the Si nitride film 515 is deposited on the entire surface, and only active regions thereof are remained by photolithography. As shown in FIG. 26D, the active regions are patterned by a RIE method, and the Si nitride mask 515 is retreated by a CDE method. As shown in FIG. 26E, the entire surface is buried with a Si oxide film 532 and then flattened by a CMP method.

After this step, the processing steps of FIGS. 19E to 20E are performed to provide a structure shown in FIG. 24.

In this way according to the present embodiment, a bulk Si region 561 is formed on one part of the Si substrate 501, and the strained SOI layer 505 and strained GOI layer 506 are formed on the other part of the Si substrate 501 with the insulating film 502 interposed therebetween to have substantially the same height. The memory circuit block 50 is fabricated in the bulk Si region 561, the interface circuit block 30 is fabricated in the strained SOI layer 505, and the CPU circuit block 40 is fabricated in the strained GOI layer 506.

In other words, the memory requiring high crystalline quality is fabricated in the bulk Si region 561, the device requiring a low power operation and a low stand-by power operation such as LOP-MOSFET or LSP-MOSFET is fabricated on the strained SOI layer 505, and the device requiring a high speed operation such as HP-MOSFET is fabricated on the strained GOI layer 506. Accordingly, the memories can be manufactured with good yield, the interface circuit block 30 can attain a low power operation and a low stand-by power operation, and the CPU circuitry block 40 can attain a high speed operation. As a result, the integrated circuit element having both high speed operation and low power consumption operation can be realized with good yield.

Ninth Embodiment

Figure 27:
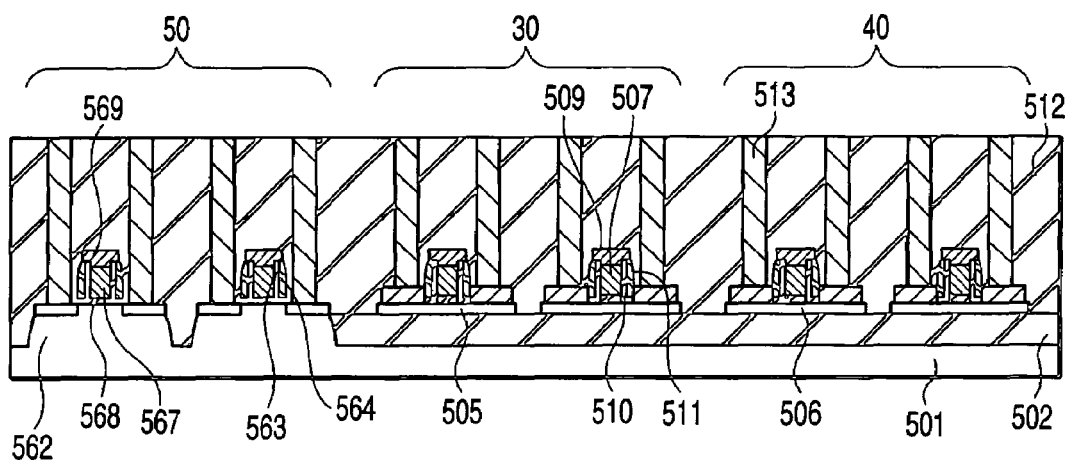
FIG. 27 is a schematic sectional view of a semiconductor device concerning a ninth embodiment of the present invention.

FIG. 27 is a schematic sectional view of a semiconductor device concerning the ninth embodiment of the present invention. In Ninth embodiment, like reference numerals are used to designate like structural elements corresponding to those like in Eighth embodiment of FIG. 24 and any further explanation is omitted for brevity's sake.

The present embodiment comprises a memory circuit block 50 configured by CMISFETs each having a channel of bulk Si layer 562, an interface circuit block 30 configured by strained SOI-CMISFETs, and a CPU circuit block 40 configured by strained GOI-CMISFETs, similarly to the eighth embodiment. However, the layered structure of the gate and the structure of the source and drain in the memory circuit block 50 differ from other two regions.

In the memory circuit block 50, the gate insulating film is formed of a Si oxynitriding film 568 of 2 nm in thickness, and the gate electrode has a layered structure of a poly Si layer 567 and a silicide NiSi film 569. The source and drain portions are formed of silicide and have an elevated structure. The side wall film is thicker than that of the other two blocks, and formed of a Si oxide film 563 of 10 nm in thickness and a Si nitride film 564 of 30 nm in maximum thickness. The structure of other two regions are common to the eighth embodiment.

A method of manufacturing a semiconductor device of the present embodiment will be described referring to FIGS. 28 to 30. The processing steps of FIGS. 25A to 26E are common to the eighth embodiment.

Figure 28A:
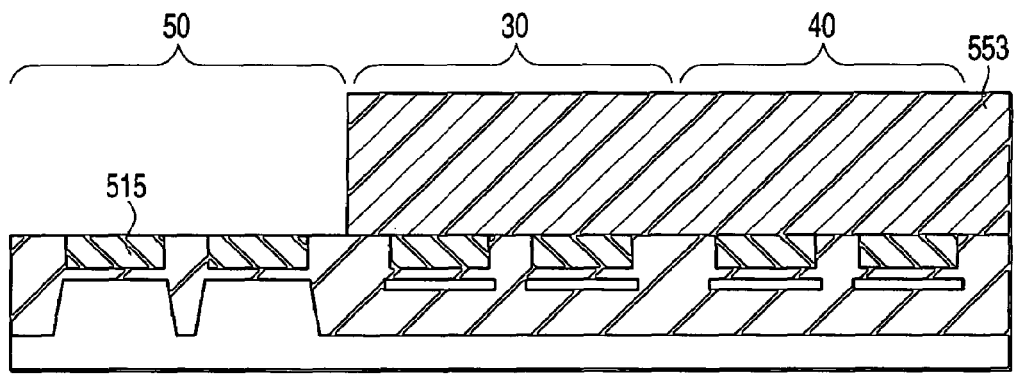
FIGS. 28A to 28D are sectional views of semiconductor structures in processing steps of a method of manufacturing the semiconductor device of the ninth embodiment.

As shown in FIG. 28A, an interface circuit block 30 and a CPU circuitry block 40 are protected by a photoresist 553.

Figure 28B:
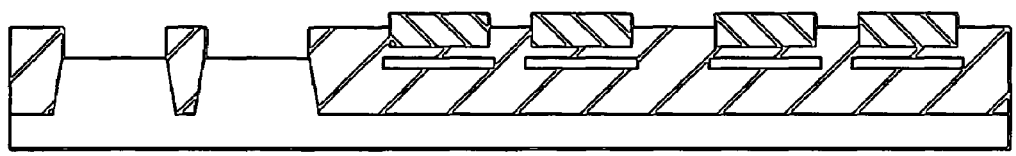

As shown in FIG. 28B, after having removed the Si nitride masking 515 of the memory circuit block 50 by a CDE method, the resist 553 is exfoliated. After having implanted B and As ions into the n and p channel regions, respectively, the Si oxide film 522 of the memory circuit block 50 is removed by diluted hydrofluoric acid.

Figure 28C:
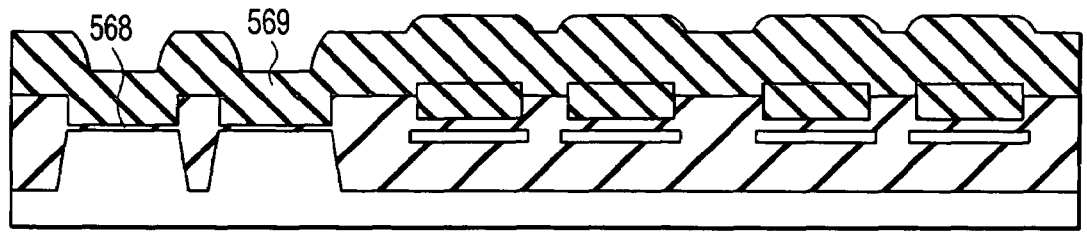

As shown in FIG. 28C, after having formed a gate insulating film 568 made of a Si oxynitriding film of 2 nm in thickness on the memory circuit block 50, a poly Si film 569 of 100 nm in thickness is deposited on the entire surface. As and BF2 ions are implanted into the n and p channel regions, respectively, and annealing is performed at 850° C. for 30 minutes in nitrogen ambient atmosphere.

Figure 28D:
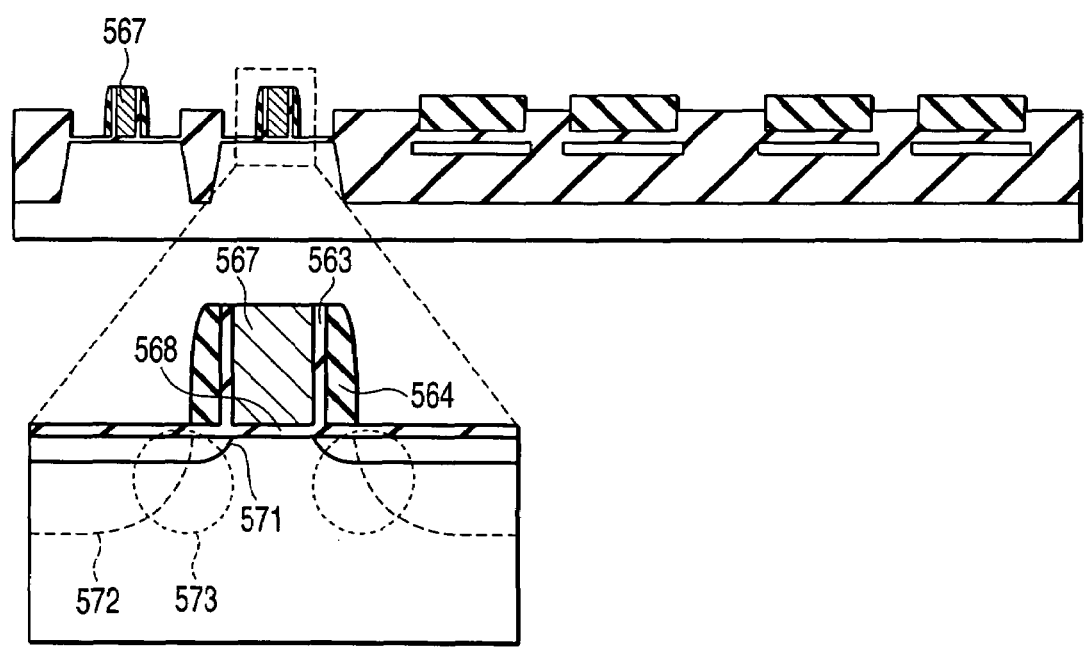

As shown in FIG. 28D, the poly Si film 569 is subjected to selective etching by a photolithography and RIE method, to form the gate electrode 567 on the memory circuit block 50. The gate side wall formed of a Si oxide film 563 and a Si nitride 564 and an ion implantation region 571 of extension are formed according to the processing steps shown in FIGS. 20A to 20C. Further, ion implantation regions 572 for source and drain are formed and halo ion implantation regions 573 are formed.

Figure 29A:
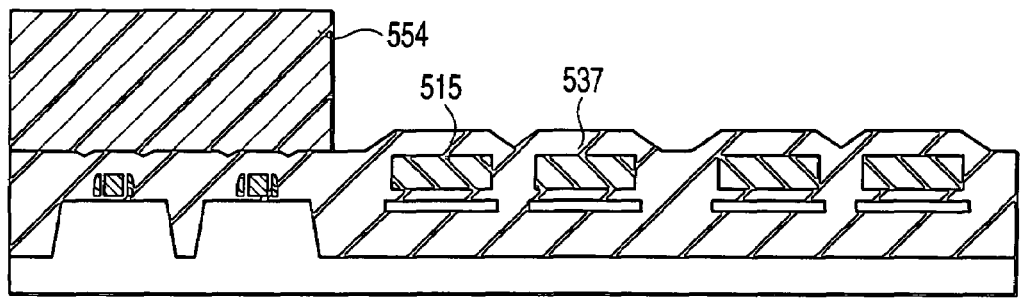
FIGS. 29A to 29D are sectional views of semiconductor structures in following processing steps of a method of manufacturing the semiconductor device of the ninth embodiment.
Figure 30:
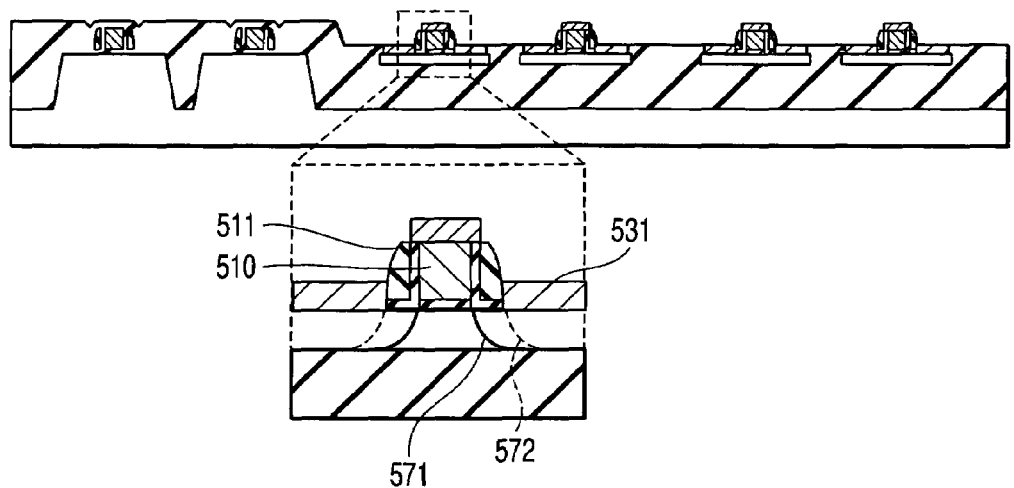
FIGS. 30A to 30C are sectional views of semiconductor structures in following processing steps of a method of manufacturing the semiconductor device of the ninth embodiment.
Figure 30:
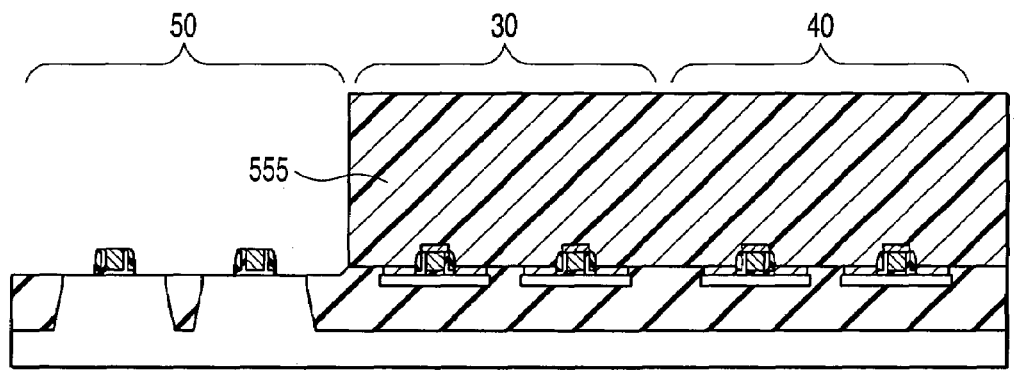
Figure 30:
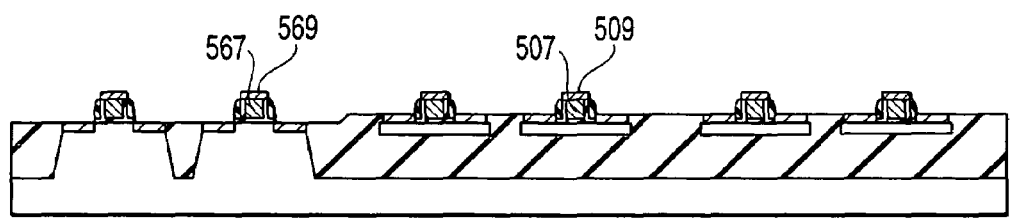

As shown in FIG. 29A, after having deposited a Si oxide film 537 on the entire surface by a CVD method, the surface of the memory circuit block 50 is protected by a resist.

Figure 29B:
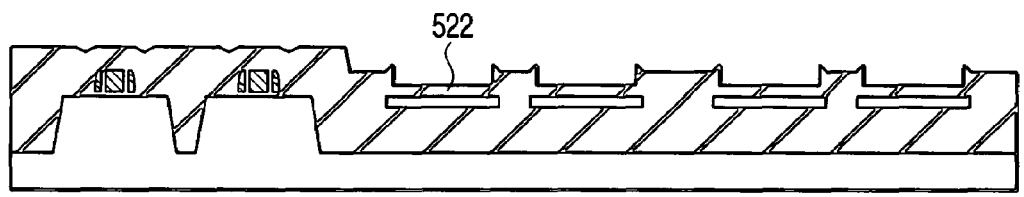

As shown in FIG. 29B, the Si oxide film 537 other than the memory circuit block 50 is removed by a RIE method to expose the surface of the Si nitride 515. After having removed the Si nitride 515 by a CDE method, the resist 554 is removed.

Figure 29C:
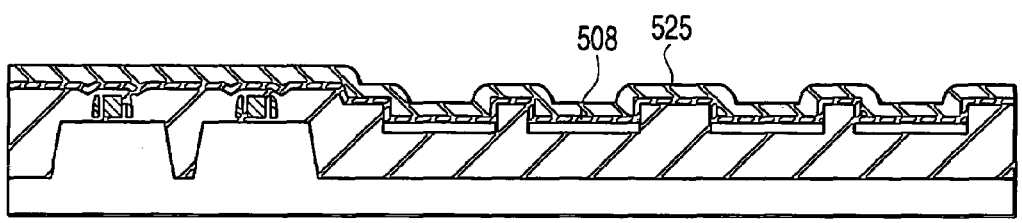

As shown in FIG. 29C, the oxide film 522 is removed by diluted hydrofluoric acid to expose the surfaces of the strained SOI and strained GOI. A HfSiON gate insulating film 508 of 3 nm in thickness and a poly Si0.35Ge0.65 film 525 of 80 nm in thickness forming the gate electrode are deposited on the entire surface in turn. As ions are implanted into the gate film 525 on the n channel region and BF2 ions are implanted into the gate film 525 on the p channel region.

Figure 29D:
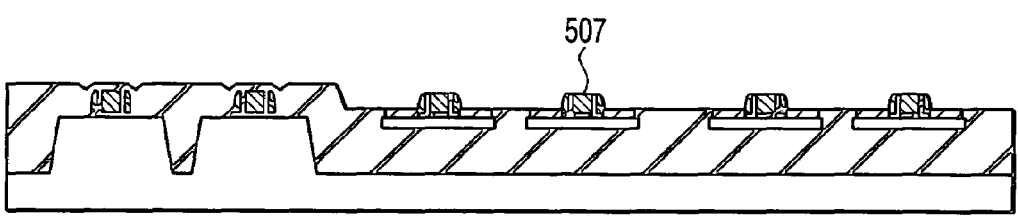

As shown in FIG. 29D, the poly Si0.35Ge0.65 film 525 is patterned by a photolithography and RIE method to form the gate electrode 507. The ion implanted region 571 of extension and the gate side walls 510 and 511 are formed according to the processing steps shown in FIGS. 20A to 20C.

As shown in FIG. 30A, after having removed the oxide film remaining on the source and drain portions, Si0.35Ge0.65 films 531 of 15 nm in thickness are formed on the exposed source and drain portions by selection epitaxial growth to form ion implanted regions 572 for source and drain.

As shown in FIG. 30B, the interface circuit block 50 and CPU circuit block 40 are protected by a photoresist 555, and the oxide film 537 on the memory circuit block 50 is removed by a RIE method and diluted hydrofluoric acid etching.

As shown in FIG. 30C, when the photoresist 555 is removed, Ni is deposited on the entire surface, and annealing is done at 600° C. for 30 minutes in nitrogen ambient atmosphere, a NiSi film 569 is formed on the source and drain portions and the upper part of the gate electrode in the memory circuit block 50, and a Ni(Si 0.35Ge0.65) film 509 is formed on the source and drain portions and the top of the gate electrode in the interface circuit block 30 and CPU circuitry block 40. Thereafter, the unreacted Ni is removed by dilute hydrochloric acid.

After this step, when an interlayer insulating film 512 and an electrode 513 are formed, a structure shown in FIG. 27 is provided.

In such a configuration, too, the memory circuit block 50 is fabricated on the bulk Si region 561, the interface circuit block 30 is fabricated on the strained SOI layer 505, and the CPU circuit block 40 is fabricated on the strained GOI layer 506. Accordingly, the present embodiment has the same effect as the eighth embodiment. In the present embodiment, if a layered structure of the gate in the memory circuit block 50 and a structure of the source and drain differ from those of two other regions, it is possible to select materials most suitable for the gate, source and drain of the memory circuit block 50. As a result, it is possible to improve the characteristics of the memory circuit block 50 further.

Tenth Embodiment

Figure 31:
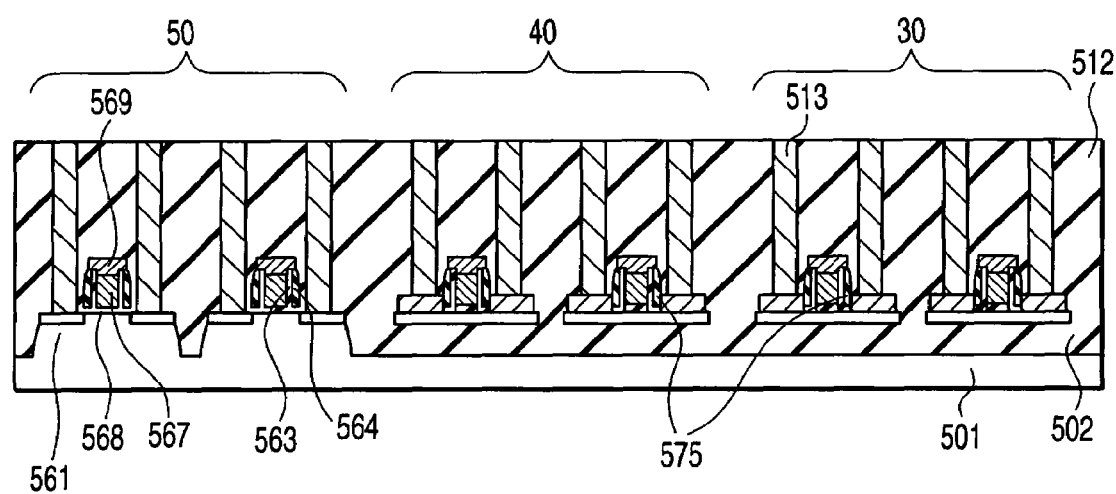
FIG. 31 is a schematic sectional view of a semiconductor device concerning a tenth embodiment of the present invention.

FIG. 31 is a schematic sectional view of a semiconductor device concerning the tenth embodiment of the present invention. In Tenth embodiment, like reference numerals are used to designate like structural elements corresponding to those like in Ninth embodiment of FIG. 27 and any further explanation is omitted for brevity's sake.

The present embodiment is similar to the ninth embodiment in basic configuration. However, the memory circuit block 50 comprises a bulk Si-CMISFET using the (100) plane as a surface plane, and other region comprises CMISFET having a channel formed of the compressive strained GOI layer 575 using the (111) plane as a surface plane.

According to such a configuration, since the (111) plane SiGe with Ge composition of more than 70% has higher mobility than the (100) plane SiGe, the current drive of the GOI-CMISFET is larger than that of the ninth embodiment comprising a channel of (100) plane. On the other hand, since the memory circuit block 50 is composed of (100) Si channels having good CMIS interfaces, enough reliability and low off-current for memory operations can be obtained.

The present embodiment uses as s starting substrate a substrate wherein a SOI layer of (111) plane direction is formed on a substrate of (100) Si with a buried insulating film interposed therebetween and can be manufactured by a wafer bonding process.

(Modification)

The individual features used in the first to the tenth embodiments, for example, the structure of the source and drain, materials of the gate insulating film or materials of the gate electrode and so on may be appropriately changed or combined. Naturally it is possible to use the value that is not specified in the embodiments as Ge composition of SiGe. Combination of circuitry blocks of the integrated circuit and channel materials thereof are not limited to the embodiments, and may be modified appropriately.

It is possible to replace the strained SOI in the embodiments by a non-strained SOI, and change the strained GOI to a strained SGOI ($0<x<1$; x=Ge composition) or an unstrained GOI. The surface orientation of the strained SOI or SOI substrate can be not only (100) plane, but also (110) plane or (111) plane. Particularly, in the case of the (111) plane, if SGOI including Ge composition of more than 70% is used, high driving force is provided.

According to the present invention, a Si thin film or a SiGe thin film is used as a single-layer and is formed to come in direct contact with an insulating film. Accordingly, if a field effect transistor suitable for each thin film and bulk Si is fabricated, it is possible to realize an integrated circuit device having a high speed operation and a low power consumption operation.

Because the Si thin film and SiGe thin film are single-layers, and come in direct contact with the insulating film, the channel layer can be thinned. Accordingly, the present invention is effective for fully-depleted operation that is a special feature of a SOI structure.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device, comprising:
a silicon oxide film formed on a substrate;
a planar Si thin film formed in direct contact with the silicon oxide film to form a first channel layer in parallel with a surface of the substrate;
a planar $Si_{1-x}Ge_x$ ($0<x<1$) thin film formed in direct contact with the silicon oxide film and substantially flush with the top of the Si thin film to form a second channel layer in parallel with the surface of the substrate;
a first field effect transistor fabricated in the Si thin film; and
a second field effect transistor fabricated in the $Si_{1-x}Ge_x$ thin film,
wherein the $Si_{1-x}Ge_x$ thin film has a compressive strain.

2. The semiconductor device according to claim 1, wherein the first field effect transistor comprises an n channel metal-insulator-semiconductor field effect transistor (MISFET), and the second field effect transistor comprises a p channel MISFET.

3. The semiconductor device according to claim 1, wherein the first field effect transistor has a gate electrode insulatively disposed over the planar Si thin film, and the second field effect transistor has a gate electrode insulatively disposed over the planar $Si_{1-x}Ge_x$ ($0<x\leq1$) thin film.

4. The semiconductor device according to claim 3, wherein the gate electrode of each of the first field effect transistor and the second field effect transistor is formed in a square shape.

5. The semiconductor device according to claim 1, wherein each of the planar Si thin film and the planar $Si_{1-x}Ge_x$ ($0<x\leq1$) thin film is formed of a single layer.

6. A semiconductor device, comprising:
a silicon oxide film formed on a substrate;
a planar Si thin film formed in direct contact with the silicon oxide film to form a first channel layer in parallel with a surface of the substrate;
a planar $Si_{1-x}Ge_x$ ($0<x<1$) thin film formed in direct contact with the silicon oxide film and substantially flush with the top of the Si thin film to form a second channel layer in parallel with the surface of the substrate;
a first field effect transistor fabricated in the Si thin film; and
a second field effect transistor fabricated in the $Si_{1-x}Ge_x$ thin film,
wherein the Si thin film has a tensile strain.

7. The semiconductor device according to claim 6, wherein the first field effect transistor comprises an n channel metal-insulator-semiconductor field effect transistor (MISFET), and the second field effect transistor comprises a p channel MISFET.

8. The semiconductor device according to claim 6, wherein the first field effect transistor has a gate electrode insulatively disposed over the planar Si thin film, and the second field effect transistor has a gate electrode insulatively disposed over the planar $Si_{1-x}Ge_x$ ($0<x\leq1$) thin film.

9. The semiconductor device according to claim 8, wherein the gate electrode of each of the first field effect transistor and the second field effect transistor is formed in a square shape.

10. The semiconductor device according to claim 6, wherein each of the planar Si thin film and the planar $Si_{1-x}Ge_x$ ($0<x\leq1$) thin film is formed of a single layer.

11. A semiconductor device, comprising:
a silicon oxide film formed on a substrate;
a planar Si thin film formed in direct contact with the silicon oxide film to form a first channel layer in parallel with a surface of the substrate;
a planar $Si_{1-x}Ge_x$ ($0<x<1$) thin film formed in direct contact with the silicon oxide film and substantially flush with the top of the Si thin film to form a second channel layer in parallel with the surface of the substrate;
a first field effect transistor fabricated in the Si thin film; and
a second field effect transistor fabricated in the $Si_{1-x}Ge_x$ thin film,
wherein the Si thin film has a tensile strain and the $Si_{1-x}Ge_x$ thin film has a compressive strain.

12. The semiconductor device according to claim 11, wherein the first field effect transistor comprises an n channel metal-insulator-semiconductor field effect transistor (MISFET), and the second field effect transistor comprises a p channel MISFET.

13. The semiconductor device according to claim 11, wherein the first field effect transistor has a gate electrode insulatively disposed over the planar Si thin film, and the second field effect transistor has a gate electrode insulatively disposed over the planar $Si_{1-x}Ge_x$ ($0<x\leq1$) thin film.

14. The semiconductor device according to claim 13, wherein the gate electrode of each of the first field effect transistor and the second field effect transistor is formed in a square shape.

15. The semiconductor device according to claim 11, wherein each of the planar Si thin film and the planar $Si_{1-x}Ge_x$ ($0<x\leq1$) thin film is formed of a single layer.

* * * * *

UNITED STATES PATENT AND TRADEMARK OFFICE
CERTIFICATE OF CORRECTION

PATENT NO.        : 7,675,115 B2                              Page 1 of 1
APPLICATION NO.   : 11/146071
DATED             : March 9, 2010
INVENTOR(S)       : Tezuka It is certified that error appears in the above-identified patent and that said Letters Patent is hereby corrected as shown below:

On The Title page, item 57, in the Abstract, line 2, change "onepart" to -- one part --.

Claim 1, column 17, line 42, change "$(0<x<1)$" to -- $(0<x\leqq1)$ --.

Claim 6, column 18, line 42, change "$(0<x<1)$" to -- $(0<x\leqq1)$ --.

Claim 11, column 18, line 37, change "$(0<x<1)$" to -- $(0<x\leqq1)$ --.

Signed and Sealed this

Eleventh Day of May, 2010

David J. Kappos
*Director of the United States Patent and Trademark Office*